United States Patent
Kim et al.

(10) Patent No.: US 12,520,586 B2
(45) Date of Patent: Jan. 6, 2026

(54) DISPLAY DEVICE WITH ORGANIC INSULATING FILL LAYER ON METAL LAYER BETWEEN PIXEL AREAS AND METHOD OF MANUFACTURING THE SAME

(71) Applicant: Samsung Display Co., Ltd., Yongin-si (KR)

(72) Inventors: Sun-Ho Kim, Seongnam-si (KR); Ju-Chan Park, Seoul (KR); Sun-Hee Lee, Hwaseong-si (KR); Hyun Kim, Seoul (KR); Jong-Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 845 days.

(21) Appl. No.: 17/420,850

(22) PCT Filed: Nov. 15, 2019

(86) PCT No.: PCT/KR2019/015604
§ 371 (c)(1),
(2) Date: Jul. 6, 2021

(87) PCT Pub. No.: WO2020/145502
PCT Pub. Date: Jul. 16, 2020

(65) Prior Publication Data
US 2022/0093705 A1    Mar. 24, 2022

(30) Foreign Application Priority Data
Jan. 7, 2019    (KR) .................. 10-2019-0001616

(51) Int. Cl.
*H10D 86/40*    (2025.01)
*H10K 59/131*    (2023.01)
(Continued)

(52) U.S. Cl.
CPC ......... *H10D 86/451* (2025.01); *H10K 59/131* (2023.02); *H10K 59/87* (2023.02);
(Continued)

(58) Field of Classification Search
CPC ........ H10K 59/12; H10K 50/84; H10K 71/00; H10K 77/111; H10K 2102/311; H10K 59/131; H10K 59/87; H10D 86/451
See application file for complete search history.

(56) References Cited

U.S. PATENT DOCUMENTS 9,082,667 B2    7/2015 Youn et al.
9,130,197 B2 *   9/2015 Kim ..................... H10K 71/231
(Continued)

FOREIGN PATENT DOCUMENTS

| CN | 104183600 A | 12/2014 |
| CN | 104600081 A | 5/2015 |

(Continued)

*Primary Examiner* — Lex H Malsawma
(74) *Attorney, Agent, or Firm* — Womble Bond Dickinson (US) LLP

(57) ABSTRACT

A display device may include a substrate including a first pixel area on which a first pixel is positioned and a second pixel area on which a second pixel is positioned, a metal layer disposed on the substrate between the first pixel area and the second pixel area, an inorganic insulating layer disposed on the metal layer and having a groove exposing at least a portion of the metal layer, and an organic insulating layer filling the groove of the inorganic insulating layer.

22 Claims, 23 Drawing Sheets

(51) Int. Cl.
  *H10K 59/80* (2023.01)
  *H10K 71/00* (2023.01)
  *H10K 77/10* (2023.01)
  *H10K 102/00* (2023.01)
(52) U.S. Cl.
  CPC ........... *H10K 71/00* (2023.02); *H10K 77/111*
           (2023.02); *H10K 2102/311* (2023.02)

(56) References Cited

U.S. PATENT DOCUMENTS

| | | | |
|---|---|---|---|
| 11,177,335 B2* | 11/2021 | Park | ................... H10K 59/131 |
| 2001/0013918 A1 | 8/2001 | Kwak et al. | |
| 2014/0315339 A1* | 10/2014 | Kim | ................ H10K 59/80522 |
| | | | 438/34 |
| 2016/0118451 A1 | 4/2016 | Youn et al. | |
| 2016/0343980 A1 | 11/2016 | Lee et al. | |
| 2016/0359054 A1 | 12/2016 | Fang et al. | |
| 2017/0077447 A1 | 3/2017 | Kang et al. | |
| 2017/0170206 A1* | 6/2017 | Lee | ....................... H10K 50/80 |
| 2018/0145125 A1 | 5/2018 | Lee et al. | |
| 2019/0041915 A1* | 2/2019 | Park | ....................... H10D 86/60 |
| 2019/0096975 A1* | 3/2019 | Park | ................... H10K 59/1213 |
| 2019/0148476 A1* | 5/2019 | Park | ..................... H10K 59/124 |
| | | | 257/40 |
| 2019/0156708 A1* | 5/2019 | Li | ............................ G09F 9/33 |
| 2019/0164995 A1* | 5/2019 | Lee | ..................... H10D 86/411 |

FOREIGN PATENT DOCUMENTS

| | | | |
|---|---|---|---|
| CN | 106783917 B | | 11/2018 |
| EP | 2814074 A1 | | 12/2014 |
| KR | 10-0315208 B1 | | 11/2001 |
| KR | 10-2016-0047132 A | | 5/2016 |
| KR | 10-2017-0032955 A | | 3/2017 |
| KR | 10-2017-0128742 A | | 11/2017 |
| KR | 10-2018-0025462 A | | 3/2018 |
| KR | 10-2018-0056497 A | | 5/2018 |
| KR | 10-2019-0055868 A | | 5/2019 |
| KR | 10-2019-0104091 A | | 9/2019 |

* cited by examiner

DISPLAY DEVICE WITH ORGANIC INSULATING FILL LAYER ON METAL LAYER BETWEEN PIXEL AREAS AND METHOD OF MANUFACTURING THE SAME

CROSS-REFERENCE TO RELATED APPLICATION

This application is a U.S. National Phase Patent Application of International Patent Application Number PCT/KR2019/015604, filed on Nov. 15, 2019, which claims priority to Korean Patent Application Number 10-2019-0001616, filed on Jan. 7, 2019, the entire content of all of which is incorporated herein by reference.

BACKGROUND

1. Field

Embodiments relate to a display device. More particularly, embodiments relate to a display device that is robust against external impact and a method of manufacturing the display device.

2. Description of Related Art

In general, a display device may include a display element and electronic elements for controlling an electrical signal applied to the display element. The electronic elements may include a transistor, a capacitor, and a plurality of lines.

To accurately control whether or not the display element emits light and the degree of light emission, the number of transistors electrically connected to one display element is increasing, and the number of lines that transmit electrical signals to the transistors is also increasing. Accordingly, research on a method of implementing high integration of a display device and reducing the occurrence of defects is being actively conducted.

SUMMARY

An object of the present invention is to provide a display device that is robust against external impact and prevents impurities from permeating.

An object of the present invention is to provide a method of manufacturing the display device.

In order to achieve the object of the present invention described above, a display device according to embodiments may include a substrate including a first pixel area on which a first pixel is positioned and a second pixel area on which a second pixel is positioned, a metal layer disposed on the substrate between the first pixel area and the second pixel area, an inorganic insulating layer disposed on the metal layer and having a groove exposing at least a portion of the metal layer, and an organic insulating layer filling the groove of the inorganic insulating layer.

In an embodiment, the groove may expose at least a portion of an upper surface of the metal layer, and the organic insulating layer may contact the upper surface of the metal layer.

In an embodiment, the display device may further include a barrier layer disposed between the substrate and the metal layer.

In an embodiment, each of the first pixel and the second pixel may include a lower gate electrode positioned on the same layer as that of the metal layer.

In an embodiment, each of the first pixel and the second pixel may further include a driving transistor including a driving gate electrode, a driving source electrode, and a driving drain electrode, and the lower gate electrode may overlap the driving transistor.

In an embodiment, the lower gate electrode may be electrically connected to the driving source electrode.

In an embodiment, the display device may further include a driving voltage line supplying a driving voltage to the driving transistor, and the lower gate electrode may be electrically connected to the driving voltage line.

In an embodiment, the organic insulating layer may extend to an upper surface of the inorganic insulating layer.

In an embodiment, the second pixel area may be positioned in a first direction from the first pixel area, and the groove of the inorganic insulating layer may extend along a second direction intersecting the first direction.

In an embodiment, the display device may further include a first connection line disposed on the organic insulating layer and extending along the first direction.

In an embodiment, the first pixel and the second pixel respectively may further include a first scan line and a second scan line disposed with the organic insulating layer therebetween, and the first scan line and the second scan line may be connected by the first connection line.

In an embodiment, an elongation rate of the first connection line may be greater than an elongation rate of the first scan line and an elongation rate of the second scan line.

In order to achieve the object of the present invention described above, a display device according to embodiments may include a substrate including a plurality of pixel areas, a metal layer disposed on the substrate between the plurality of pixel areas, an inorganic insulating layer disposed on the metal layer and having a groove exposing at least a portion of the metal layer, and an organic insulating layer filling the groove of the inorganic insulating layer.

In an embodiment, the organic insulating layer may surround at least a portion of the plurality of the pixel areas.

In an embodiment, the organic insulating layer may surround each of the plurality of the pixel areas.

In an embodiment, the display device may further include a first connection line disposed on the organic insulating layer, extending in a first direction, and crossing the plurality of pixel areas.

In an embodiment, the display device may further include a second connection line insulated from the first connection line, extending in a second direction intersecting the first direction, and crossing the plurality of pixel areas.

In order to achieve the object of the present invention described above, a method of manufacturing a display device according to embodiments may include forming a metal layer on a substrate between a first pixel area and a second pixel area, forming an inorganic insulating layer on the metal layer, forming a groove exposing at least a portion of the metal layer in the inorganic insulating layer, and forming an organic insulating layer filling the groove of the inorganic insulating layer.

In an embodiment, the method may further include forming a first lower gate electrode and a second lower gate electrode respectively in the first pixel area and the second pixel area on the substrate, and the metal layer, the first lower gate electrode, and the second lower gate electrode are simultaneously formed.

In an embodiment, the method may further include forming a first driving transistor and a second driving transistor respectively overlapping the first lower gate electrode and the second gate electrode.

In an embodiment, the method may further include forming a first connection line extending from the first pixel area to the second pixel area on the organic insulating layer.

In an embodiment, the method may further include forming a first scan line and a second scan line respectively in the first pixel area and the second pixel area on the substrate, the first scan line and the second scan line being disposed with the organic insulating layer therebetween, and the first scan line and the second scan line may be connected by the first connection line.

In the display device according to the embodiments, the metal layer may be disposed under the groove of the inorganic insulating layer filled with the organic insulating layer, so that a thickness of the insulating layer and the substrate under the metal layer may not decrease. Accordingly, impurities may be prevented from flowing through the insulating layer and the substrate under the organic insulating layer.

In the method of manufacturing the display device according to the embodiments, the metal layer serving as an etch stop layer may be formed under the groove of the inorganic insulating layer before forming the groove of the inorganic insulating layer filled with the organic insulating layer, so that the insulating layer and the substrate under the metal layer may not be etched. Accordingly, the groove of the inorganic insulating layer having a uniform depth may be formed. Further, the metal layer may be formed substantially simultaneously with the lower gate electrode of the driving transistor. Accordingly, an additional process for forming the metal layer may not be required.

DETAILED DESCRIPTION

Hereinafter, display devices and methods of manufacturing display devices in accordance with embodiments of the present invention will be explained in detail with reference to the accompanying drawings.

Figure 1:
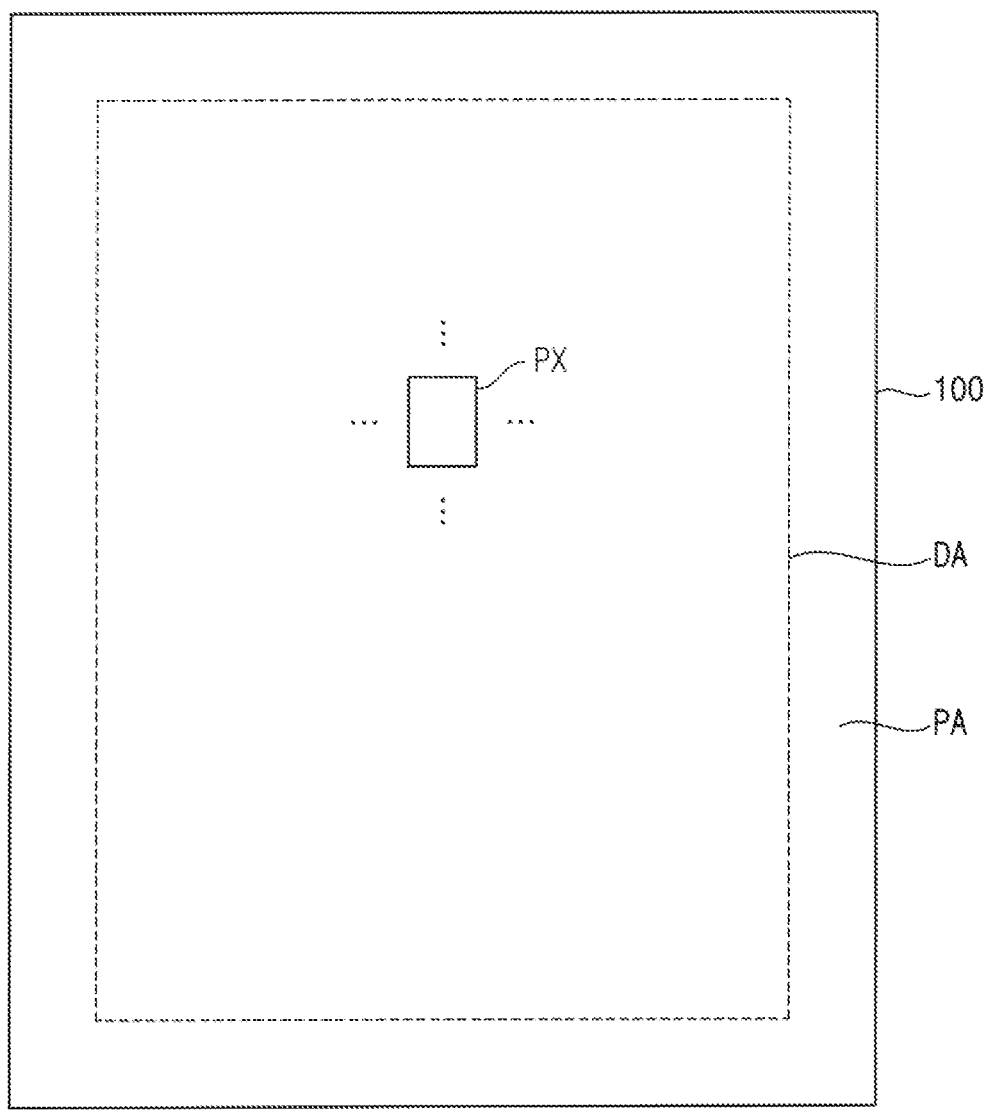
FIG. 1 is a plan view illustrating a display device according to an embodiment.

FIG. 1 is a plan view illustrating a display device according to an embodiment.

Referring to FIG. 1, a display device according to an embodiment may include a substrate 100 including a display area DA and a peripheral area PA outside the display area DA. A plurality of pixels PX including a display element such as an organic light emitting diode (OLED) or the like may be disposed in the display area DA. Lines that transmit electrical signals applied to the display area DA may be disposed in the peripheral area PA. Hereinafter, a display device including an organic light emitting diode as the display element will be described. However, the present invention is not limited thereto, and may be applied to various types of display devices such as a liquid crystal display device, an electrophoretic display device, or the like.

Figure 2:
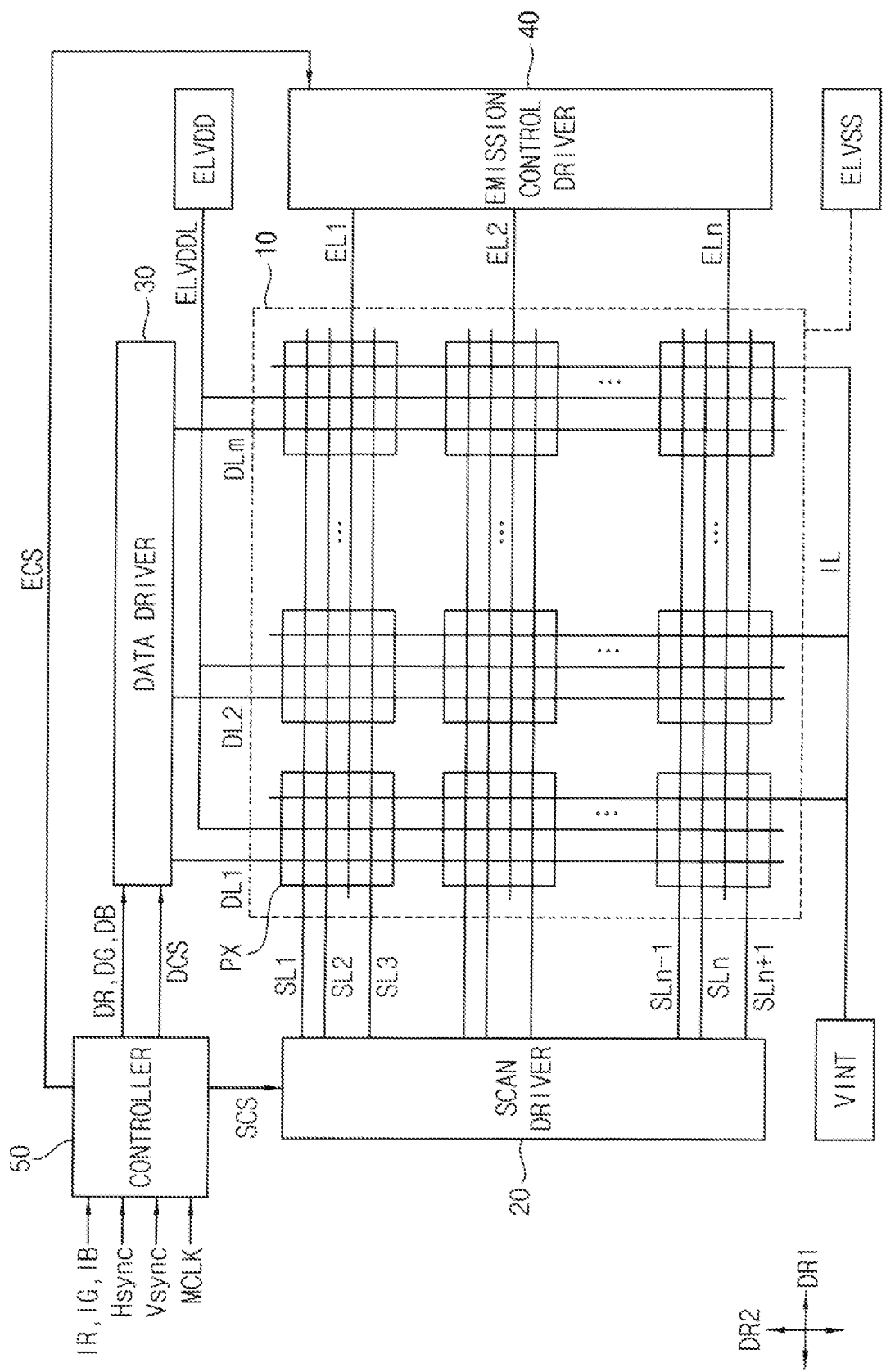
FIG. 2 is a block diagram illustrating the display device in FIG. 1.

FIG. 2 is a block diagram illustrating the display device in FIG. 1.

Referring to FIG. 2, a display device according to an embodiment may include a display unit 10 including a plurality of pixels PX, a scan driver 20, a data driver 30, and an emission control driver 40, and a controller 50.

The display unit 10 may be disposed in the display area. The display unit 10 may include the plurality of pixels PX positioned at intersections of a plurality of scan lines SL1 to SLn+1, a plurality of data lines DL1 to DLm, and a plurality of emission control lines EL1 to ELn. Thus, the plurality of pixels PX may be arranged in a substantially matrix form. The scan lines SL1 to SLn+1 and the emission control lines EL1 to ELn may extend in a first direction DR1 that is a row direction, and the data lines DL1 to DLm and a driving voltage line ELVDDL may extend in a second direction DR2 that is a column direction.

Each pixel PX may be connected to three scan lines among the scan lines SL1 to SLn+1. The scan driver 20 may transmit three scan signals to each pixel PX through the scan lines SL1 to SLn+1. In other words, the scan driver 20 may sequentially supply scan signals to scan lines SL2 to SLn, previous scan lines SL1 to SLn-1, and subsequent scan lines SL3 to SLn+1.

Each pixel PX may be connected to one of the data lines DL1 to DLm. The data driver 30 may transmit a data signal to each pixel PX through the data lines DL1 to DLm. The data signal may be supplied to the pixel PX selected by a scan signal when the scan signal is supplied to the scan lines SL2 to SLn.

Each pixel PX may be connected to one of the emission control lines EL1 to ELn. The emission control driver 40 may transmit an emission control signal to each pixel PX through the emission control lines EL1 to ELn. The emission control signal may control the emission time of the pixel PX. The emission control driver 40 may be omitted depending on an internal structure of the pixel PX.

The controller 50 may convert a plurality of image signals IR, IG, and IB transmitted from the outside into a plurality of image data signals DR, DG, and DB, and transmit the converted image data signals DR, DG, and DB to the data driver 30. In addition, the controller 50 may receive a vertical synchronization signal Vsync, a horizontal synchronization signal Hsync, and a clock signal MCLK, and may generate control signals for controlling the scan driver 20, the data driver 30, and the emission control driver 40. In other words, the controller 50 may generate a scan driving control signal SCS for controlling the scan driver 20, a data driving control signal DCS for controlling the data driver 30, and an emission driving control signal ECS for controlling the emission control driver 40.

Each pixel PX may receive a driving voltage ELVDD and a common voltage ELVSS from external power sources. The driving voltage ELVDD may be a predetermined high level voltage, and the common voltage ELVSS may be a voltage lower than the driving voltage ELVDD or a ground voltage. The driving voltage ELVDD may be supplied to each pixel PX through the driving voltage line ELVDDL. An initialization voltage line IL may receive an initialization voltage VINT from an external power source and supply the initialization voltage VINT to each pixel PX.

Each pixel PX may emit light having a predetermined luminance by a driving current supplied to a light emitting element according to the data signal transmitted through the data lines DL1 to DLm.

Figure 3:
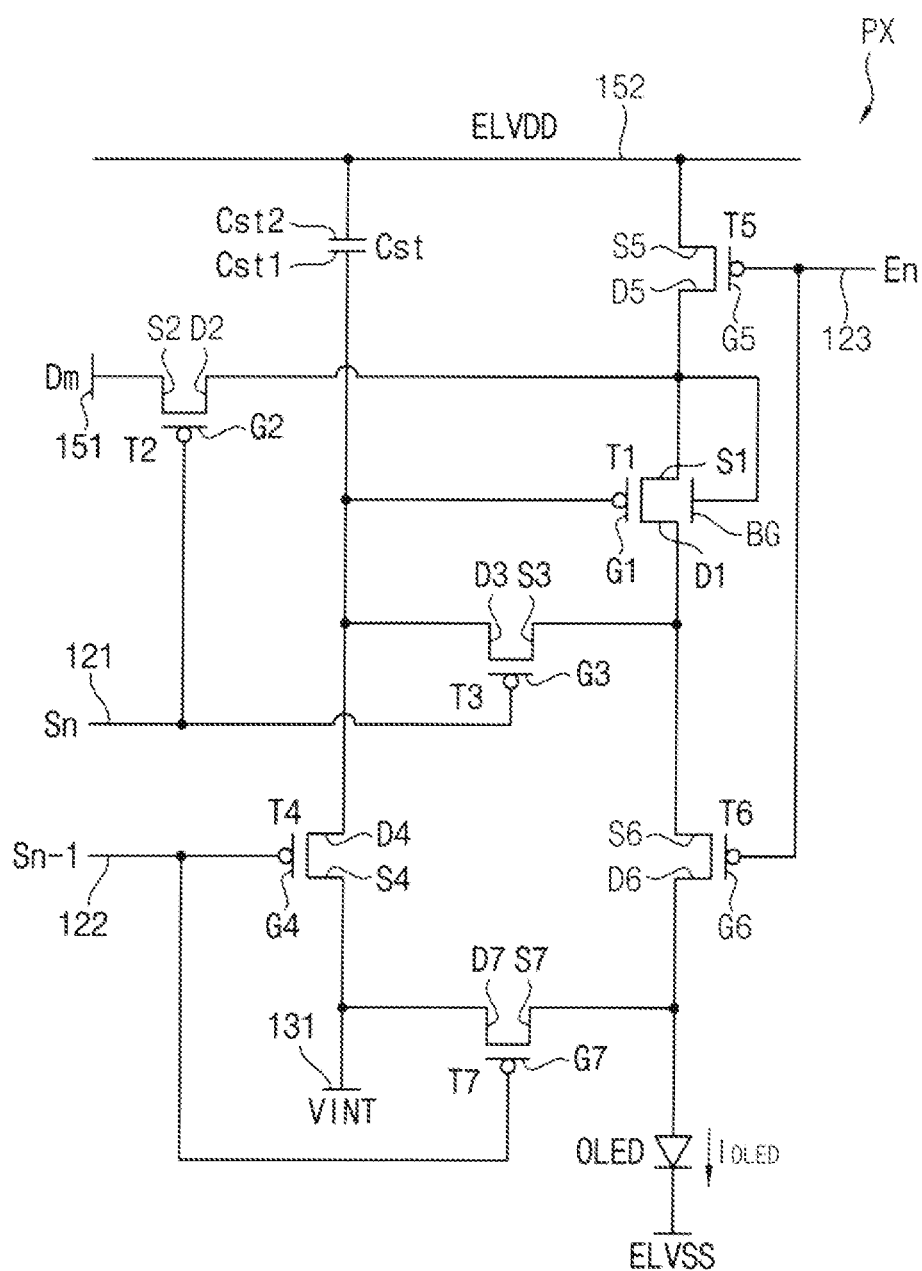
FIG. 3 is a circuit diagram illustrating a pixel according to an embodiment.

FIG. 3 is a circuit diagram illustrating a pixel according to an embodiment.

Referring to FIG. 3, each pixel PX may include signal lines 121, 122, 123, and 151, a plurality of transistors T1, T2, T3, T4, T5, T6, and T7 connected thereto, a storage capacitor Cst, an initialization voltage line 131, a driving voltage line 152, and an organic light emitting diode OLED.

FIG. 3 illustrates that the signal lines 121, 122, 123, 151, the initialization voltage line 131, and the driving voltage line 152 are provided for each pixel PX, however, the present invention is not limited thereto. In another embodiment, at least one of the signal lines 121, 122, 123, and 151 and/or the initialization voltage line 131 may be shared by neighboring pixels.

The transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The signal lines 121, 122, 123, and 151 may include a scan line 121 that transmits a scan signal Sn, a previous scan line 122 that transmits a previous scan signal Sn−1 to the first initialization transistor T4 and the second initialization transistor T7, an emission control line 123 that transmits an emission control signal En to the operation control transistor T5 and the emission control transistor T6, and a data line 151 that intersects the scan line 121 and transmits a data signal Dm. The driving voltage line 152 may transmit a driving voltage ELVDD to the driving transistor T1, and the initialization voltage line 131 may transmit an initialization voltage VINT for initializing the driving transistor T1 and an anode of the organic light emitting diode OLED.

A driving gate electrode G1 of the driving transistor T1 may be connected to a first electrode Cst1 of the storage capacitor Cst, and a driving source electrode S1 of the driving transistor T1 may be connected to the driving voltage line 152 via the operation control transistor T5, and a driving drain electrode D1 of the driving transistor T1 may be electrically connected to the anode of the organic light emitting diode OLED via the emission control transistor T6. The driving transistor T1 may receive the data signal Dm according to the switching operation of the switching transistor T2 and supply a driving current $I_{OLED}$ to the organic light emitting device OLED.

In an embodiment, the driving transistor T1 may be a double gate type transistor including two gate electrodes. For example, the driving transistor T1 may include the driving gate electrode G1 and a lower gate electrode BG as gate electrodes. When the driving transistor T1 further includes the lower gate electrode BG, since the current movement path of the driving transistor T1 expands, the charge mobility of the driving transistor T1 may increase. In an embodiment, the lower gate electrode BG may be electrically connected to the driving source electrode S1. In such an embodiment, the voltage of the driving source electrode S1 may be supplied to the lower gate electrode BG.

A switching gate electrode G2 of the switching transistor T2 may be connected to the scan line 121, a switching source electrode S2 of the switching transistor T2 may be connected to the data line 151, and a switching drain electrode D2 of the switching transistor T2 may be connected to the driving source electrode S1 of the driving transistor T1 and connected to the driving voltage line 152 via the operation control transistor T5. The switching transistor T2 may perform a switching operation in which the switching transistor T2 is turned on according to the scan signal Sn transmitted through the scan line 121 and transmits the data signal Dm transmitted through the data line 151 to the driving source electrode S1 of the driving transistor T1.

A compensation gate electrode G3 of the compensation transistor T3 may be connected to the scan line 121, and a compensation source electrode S3 of the compensation transistor T3 may be connected to the driving drain electrode D1 of the driving transistor T1 and connected to the anode of the organic light emitting diode OLED via the emission control transistor T6, and a compensation drain electrode D3 of the compensation transistor T3 may be connected to the first electrode Cst1 of the storage capacitor Cst, a first initialization drain electrode D4 of the initialization transistor T4, and the driving gate electrode G1 of the driving transistor T1. The compensation transistor T3 may be turned on according to the scan signal Sn transmitted through the scan line 121 and electrically connect the driving gate electrode G1 and the driving drain electrode D1 of the driving transistor T1 to diode-connect the driving transistor T1.

A first initialization gate electrode G4 of the first initialization transistor T4 may be connected to the previous scan line 122, and a first initialization source electrode S4 of the first initialization transistor T4 may be connected to a second initialization drain electrode D7 of the second initialization transistor T7 and the initialization voltage line 131, and a first initialization drain electrode D4 of the first initialization transistor T4 may be connected to the first electrode Cst1 of the storage capacitor Cst, the compensation drain electrode D3 of the compensation transistor T3, and the driving gate electrode G1 of the driving transistor T1. The first initialization transistor T4 may perform an initialization operation in which the first initialization transistor T4 is turned on according to the previous scan signal Sn−1 transmitted through the previous scan line 122 and transmits the initialization voltage VINT to the driving gate electrode G1 of the driving transistor T1 to initialize the voltage of the driving gate electrode G1 of the driving transistor T1.

An operation control gate electrode G5 of the operation control transistor T5 may be connected to the emission control line 123, an operation control source electrode S5 of the operation control transistor T5 may be connected to the driving voltage line 152, and an operation control drain electrode D5 of the operation control transistor T5 may be connected to the driving source electrode S1 of the driving transistor T1 and the switching drain electrode D2 of the switching transistor T2.

An emission control gate electrode G6 of the emission control transistor T6 may be connected to the emission control line 123, an emission control source electrode S6 of the emission control transistor T6 may be connected to the driving drain electrode D1 of the driving transistor T1 and the compensation source electrode S3 of the compensation transistor T3, and an emission control drain electrode D6 of the emission control transistor T6 may be connected to a second initialization source electrode S7 of the second initialization transistor T7 and the anode of the organic light emitting diode OLED.

The operation control transistor T5 and the emission control transistor T6 may be simultaneously turned on according to the emission control signal En transmitted through the emission control line 123, and thus, the driving voltage ELVDD may be transmitted to the organic light emitting diode OLED so that the driving current $I_{OLED}$ may flow through the organic light emitting diode OLED.

A second initialization gate electrode G7 of the second initialization transistor T7 may be connected to the previous scan line 122, a second initialization source electrode S7 of the second initialization transistor T7 may be connected to the emission control drain electrode D6 of the emission control transistor T6 and the anode of the organic light emitting diode OLED, and a second initialization drain electrode D7 of the second initialization transistor T7 may be connected to the first initialization source electrode S4 of the first initialization transistor T4 and the initialization voltage line 131. The second initialization transistor T7 may be turned on according to the previous scan signal Sn−1 transmitted through the previous scan line 122 to initialize the anode of the organic light emitting diode OLED.

FIG. 3 illustrates that the first initialization transistor T4 and the second initialization transistor T7 are connected to the previous scan line 122, however, the present invention is not limited thereto. In another embodiment, the first initialization transistor T4 may be connected to the previous scan line 122 and driven according to the previous scan signal Sn−1, and the second initialization transistor T7 may be connected to a separate signal line (e.g., the subsequent scan line) and driven according to a signal transmitted to the separate signal line. Positions of the source electrodes S1 to S7 and the drain electrodes D1 to D7 in FIG. 3 may be changed according to the type of transistor (p-type or n-type).

A specific operation of each pixel PX according to an embodiment is as follows.

During an initialization period, when the previous scan signal Sn−1 is supplied through the previous scan line 122, the initialization transistor T4 may be turned on in response to the previous scan signal Sn−1, and the driving transistor T1 may be initialized by the initialization voltage VINT supplied from the initialization voltage line 131.

During a data programming period, when the scan signal Sn is supplied through the scan line 121, the switching transistor T2 and the compensation transistor T3 may be turned on in response to the scan signal Sn. In this case, the driving transistor T1 may be diode-connected by the turned-on compensation transistor T3 and biased in the forward direction.

Then, a compensation voltage (Dm+Vth, Vth is a negative value) reduced by a threshold voltage Vth of the driving transistor T1 from the data signal Dm supplied from the data line 151 may be applied to the driving gate electrode G1 of the driving transistor T1. In this case, the driving voltage ELVDD and the compensation voltage Dm+Vth may be applied to opposite electrodes Cst1 and Cst2 of the storage capacitor Cst, and electric charges corresponding to the voltage difference between the opposite electrodes Cst1 and Cst2 may be stored in the storage capacitor Cst.

During an emission period, the operation control transistor T5 and the emission control transistor T6 may be turned on by the emission control signal En supplied from the emission control line 123. The driving current $I_{OLED}$ may be generated according to the voltage difference between the voltage of the gate electrode G1 of the driving transistor T1 and the driving voltage ELVDD, and the driving current $I_{OLED}$ may be supplied to the organic light emitting diode OLED through the emission control transistor T6.

Figure 4:
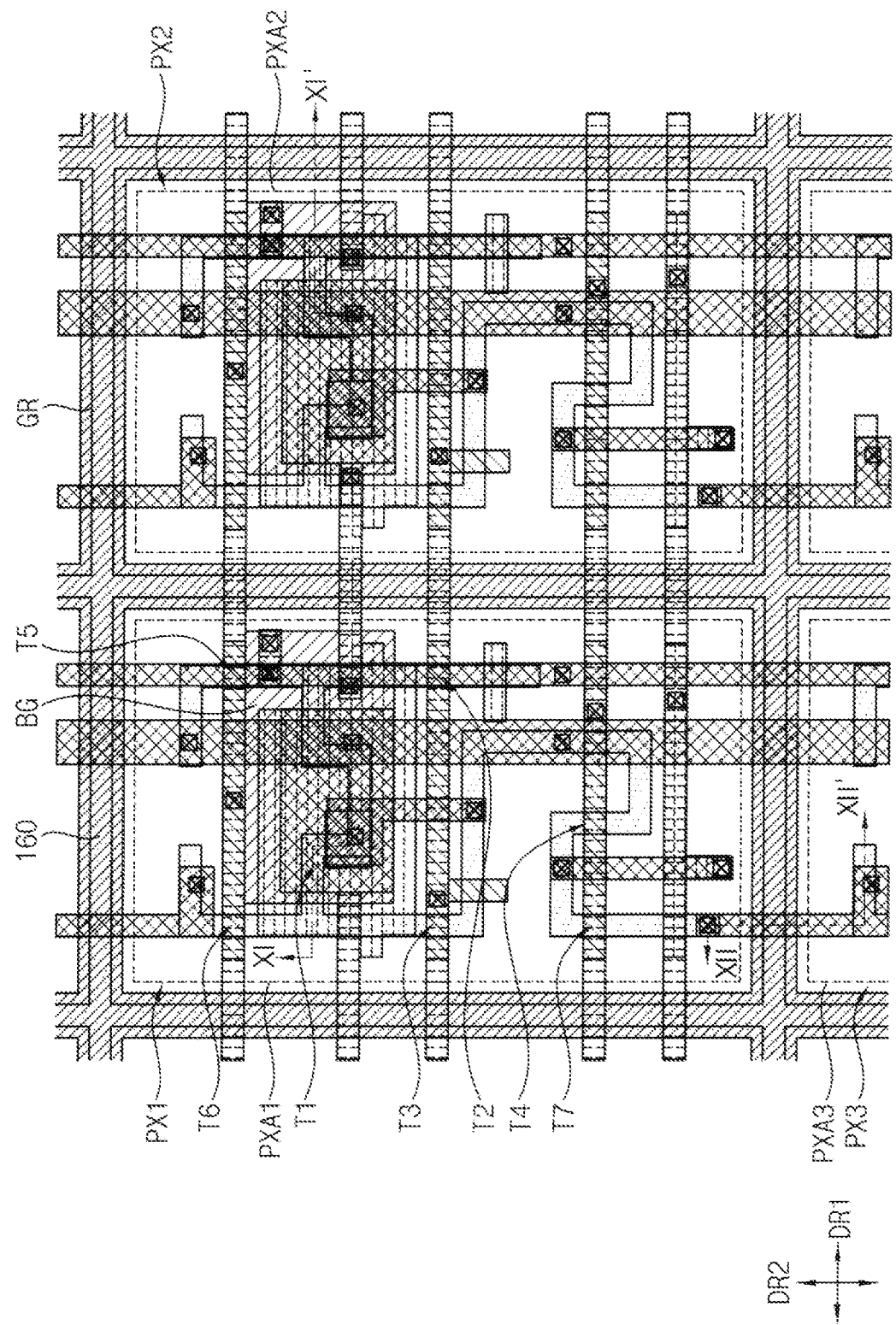
FIG. 4 is a layout view illustrating adjacent pixels according to an embodiment.
Figure 11:
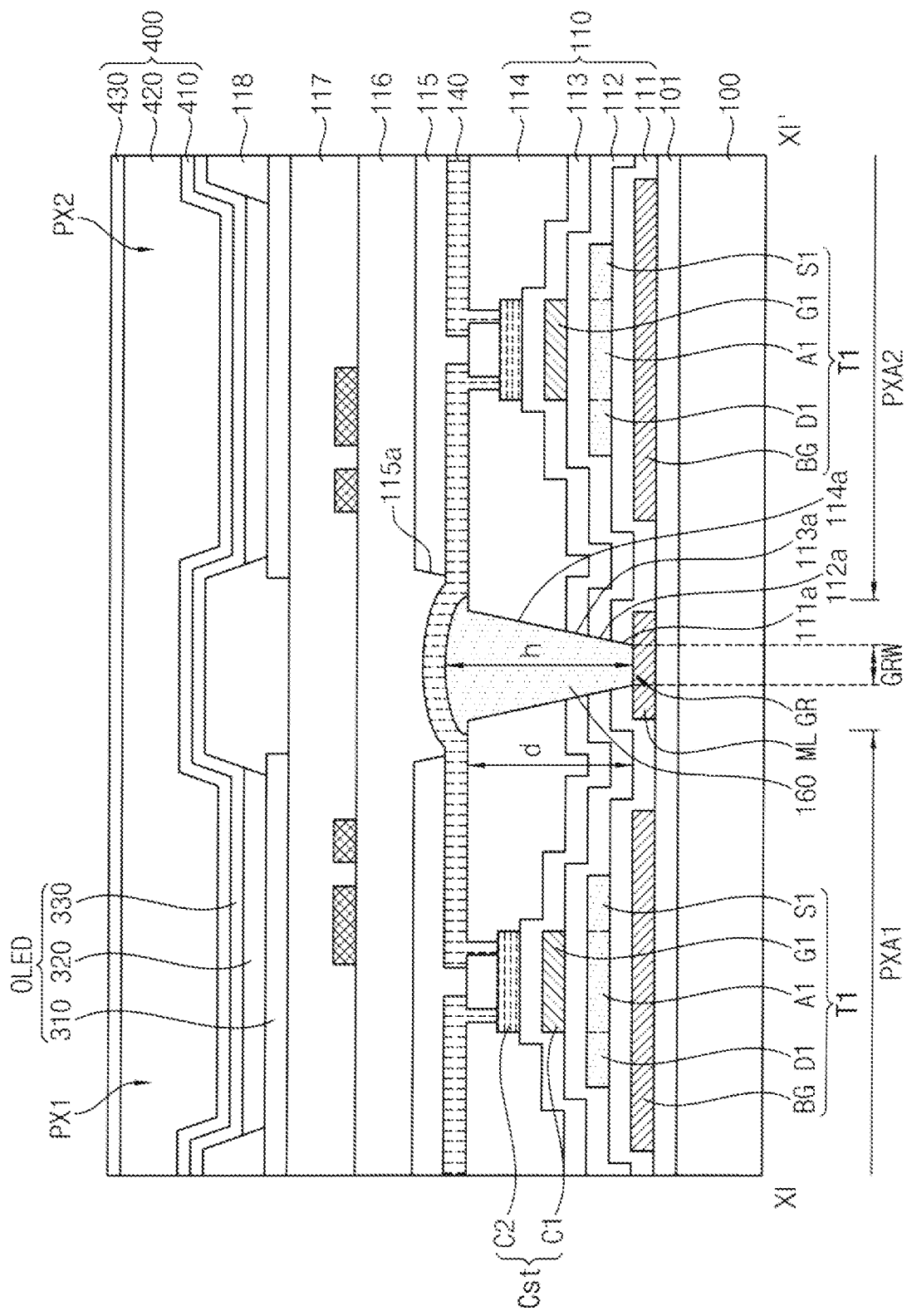
FIG. 11 is a cross-sectional view taken along a line XI-XI' in FIG. 4.
Figure 12:
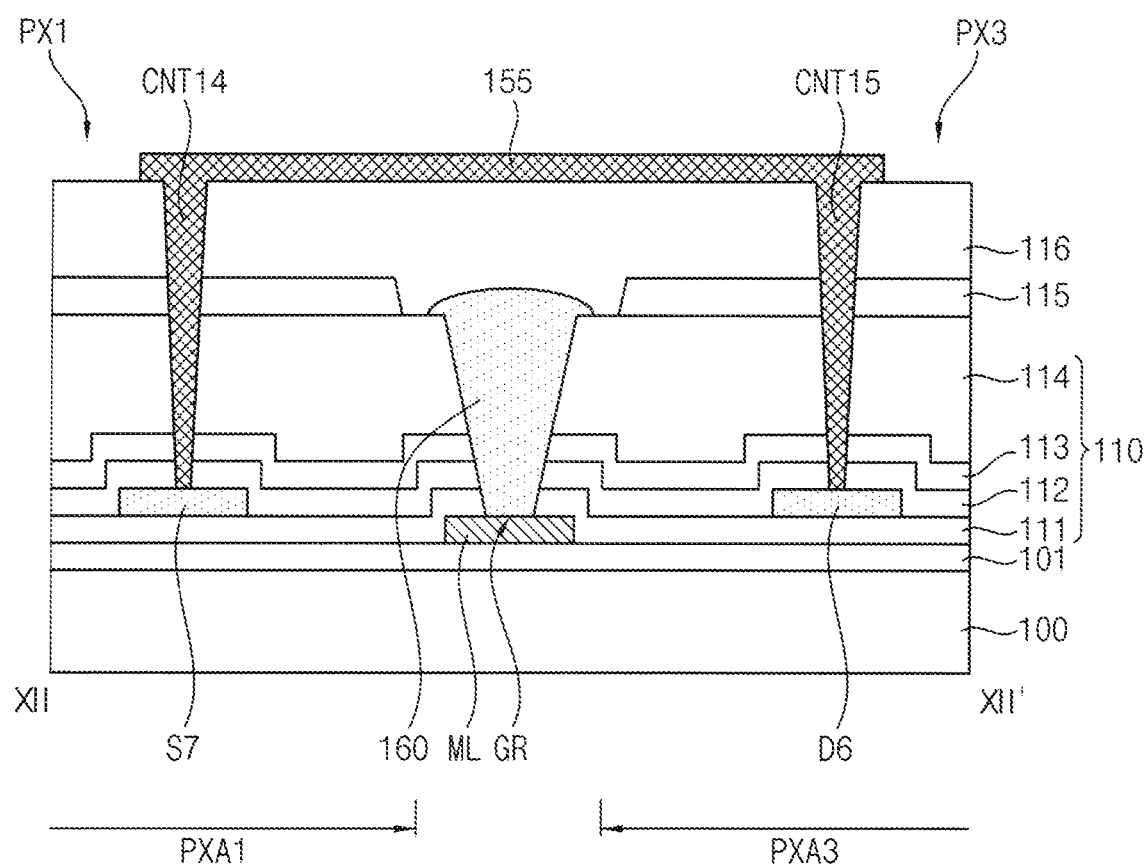
FIG. 12 is a cross-sectional view taken along a line XII-XII' in FIG. 4.

FIG. 4 is a layout view illustrating adjacent pixels according to an embodiment. FIGS. 5, 6, 7, 8, 9, and 10 are layout views illustrating elements in FIG. 4 for each layer. FIG. 11 is a cross-sectional view taken along a line XI-XI' in FIG. 4. FIG. 12 is a cross-sectional view taken along a line XII-XII' in FIG. 4.

Referring to FIGS. 4 to 11, a display device according to an embodiment may include a metal layer ML disposed between a plurality of pixel areas PXA1, PXA2, and PXA3 (between pixel areas PXA1 and PXA2 as illustrated in FIG. 11), an inorganic insulating layer 110 having a groove GR that exposes at least a portion of the metal layer ML, and an organic insulating layer 160 filling the groove GR of the inorganic insulating layer 110. Further, the display device may include a first connection line 140 disposed on the organic insulating layer 160 and extending along the first direction DR1 and a second connection line 150 insulated from the first connection line 140 and extending along the second direction DR2.

In the present embodiment, a buffer layer 111, a first insulating layer 112, a second insulating layer 113, and a third insulating layer 114 disposed under the first connection line 140 and including an inorganic insulating material may be collectively referred to as the inorganic insulating layer 110. The inorganic insulating layer 110 may have the grooves GR between adjacent pixel areas.

FIG. 11 illustrates that the inorganic insulating layer 110 has the groove GR. In other words, the buffer layer 111, the first insulating layer 112, the second insulating layer 113, and the third insulating layer 114 have openings 111a, 112a, 113a, and 114a between adjacent pixel areas (adjacent pixel areas PXA1 and PXA2 as illustrated in FIG. 11). Accordingly, it may be understood that the inorganic insulating layer 110 including the buffer layer 111, the first insulating layer 112, the second insulating layer 113, and the third insulating layer 114 has the groove GR between adjacent pixel areas PXA1, PXA2, and PXA3. The groove GR may mean a trench formed in the inorganic insulating layer 110.

A width of the groove GR of the inorganic insulating layer 110 may be several micrometers (µm). For example, the width of the groove GR of the inorganic insulating layer 110 may be about 5 µm to about 10 µm.

The organic insulating layer 160 may be filled in the groove GR of the inorganic insulating layer 110. Between the pixel areas PXA1, PXA2, and PXA3 where the organic insulating layer 160 is positioned, the first connection line 140 and the second connection line 150 may be positioned on the organic insulating layer 160. A detailed description of the organic insulating layer 160 will be described below.

The groove GR of the inorganic insulating layer 110 and the organic insulating layer 160 may be positioned in at least a portion between the pixel areas PXA1, PXA2, and PXA3. In FIG. 4, the groove GR of the inorganic insulating layer 110 and the organic insulating layer 160 may be disposed to surround each of the pixel areas PXA1, PXA2, and PXA3. In other words, the organic insulating layer 160 may be disposed to surround the circumference of a first pixel PX1 and the circumference of a second pixel PX2. However, the present invention is not limited thereto.

For example, the groove GR of the inorganic insulating layer 110 and the organic insulating layer 160 may not surround each of the pixel areas PXA1, PXA2, and PXA3, and may be formed to extend in the second direction DR2 between the pixel areas PXA1, PXA2, and PXA3 (between the pixel areas PXA1 and PXA2 and between the pixel areas PXA2 and PXA3). In addition, the groove GR of the inorganic insulating layer 110 and the organic insulating layer 160 may be formed to extend in the first direction DR1 between the pixel areas PXA1, PXA2, and PXA3 (between the pixel areas PXA1 and PXA3 and between the pixels areas PXA2 and PXA3).

The groove GR of the inorganic insulating layer 110 and the organic insulating layer 160 may minimize an influence of the display device due to an external impact. Since the inorganic insulating layer 110 has a higher hardness than that of the organic insulating layer 160, the possibility of cracking the inorganic insulating layer 110 due to external impact may be relatively high. When the inorganic insulating layer 110 is cracked, cracks may also occur in signal lines disposed inside or on the inorganic insulating layer 110, and defects such as a disconnection may occur.

However, in the display device according to the present embodiment, the inorganic insulating layer 110 may have the groove GR between the plurality of pixel areas PXA1, PXA2, and PXA3 (between pixel areas PXA1 and PXA2 as illustrated in FIG. 11 and between pixel areas PXA1 and PXA3 as illustrated in FIG. 12), and the organic insulating layer 160 may fill the groove GR of the inorganic insulating layer 110, so that the probability of crack propagation may decrease even if an external impact occurs. In addition, since the organic insulating layer 160 has a hardness lower than that of the inorganic insulating layer 110, the organic insulating layer 160 may absorb a stress caused by external impact, and the concentration of stress on the first connection line 140 and the second connection line 150 disposed on the organic insulating layer 160 may be effectively reduced.

In the present embodiment, the metal layer ML may be disposed under the organic insulating layer 160 filling the groove GR of the inorganic insulating layer 110. In the case of forming the groove GR by etching the inorganic insulating layer 110, if there is no metal layer ML, only the inorganic insulating layers and the substrate 100 may exist between the pixel areas PXA1, PXA2, and PXA3. Therefore, a depth of the groove GR may not be constant according to an etching time. When the depth of the groove GR increases beyond a predetermined depth, a thickness of the inorganic insulating layers and the substrate 100 positioned under the groove GR may be reduced to a predetermined thickness or less, and accordingly, impurities such as moisture and oxygen from outside may easily flow through the inorganic insulating layers and the substrate 100 under the groove GR having a relatively small thickness.

However, in the display device according to the present embodiment, the metal layer ML may be formed between the pixel areas PXA1, PXA2, and PXA3 before the groove GR of the inorganic insulating layer 110 is formed. When etching the inorganic insulating layer 110 to form the groove GR of the inorganic insulating layer 110, the metal layer ML may serve as an etch stop layer. Accordingly, the depth of the groove GR of the inorganic insulating layer 110 may not increase beyond a predetermined depth due to the metal layer ML, and the thickness of the inorganic insulating layers and the substrate 100 under the groove GR for blocking the inflow of impurities from the outside may be secured.

Figure 9:
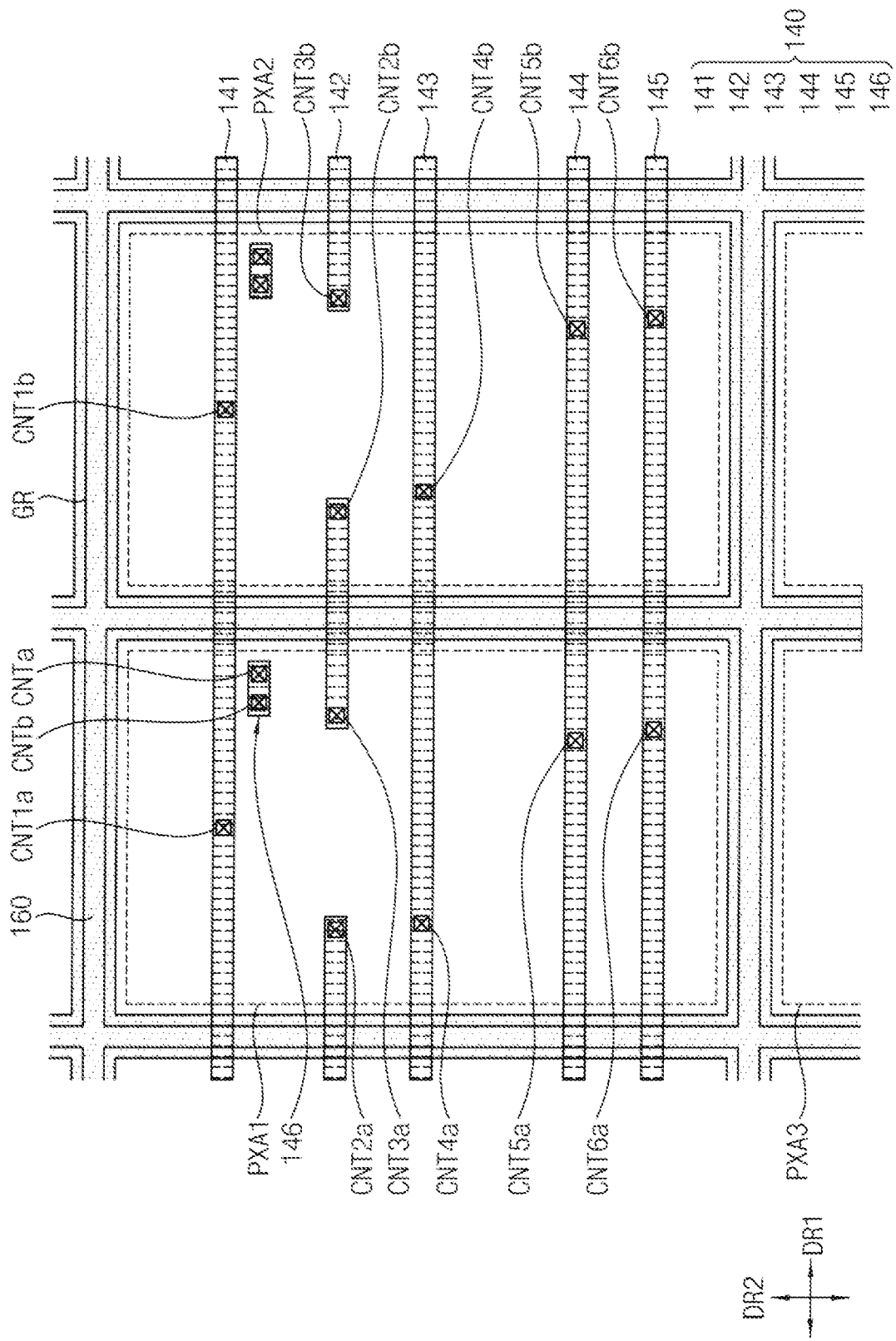
Figure 10:
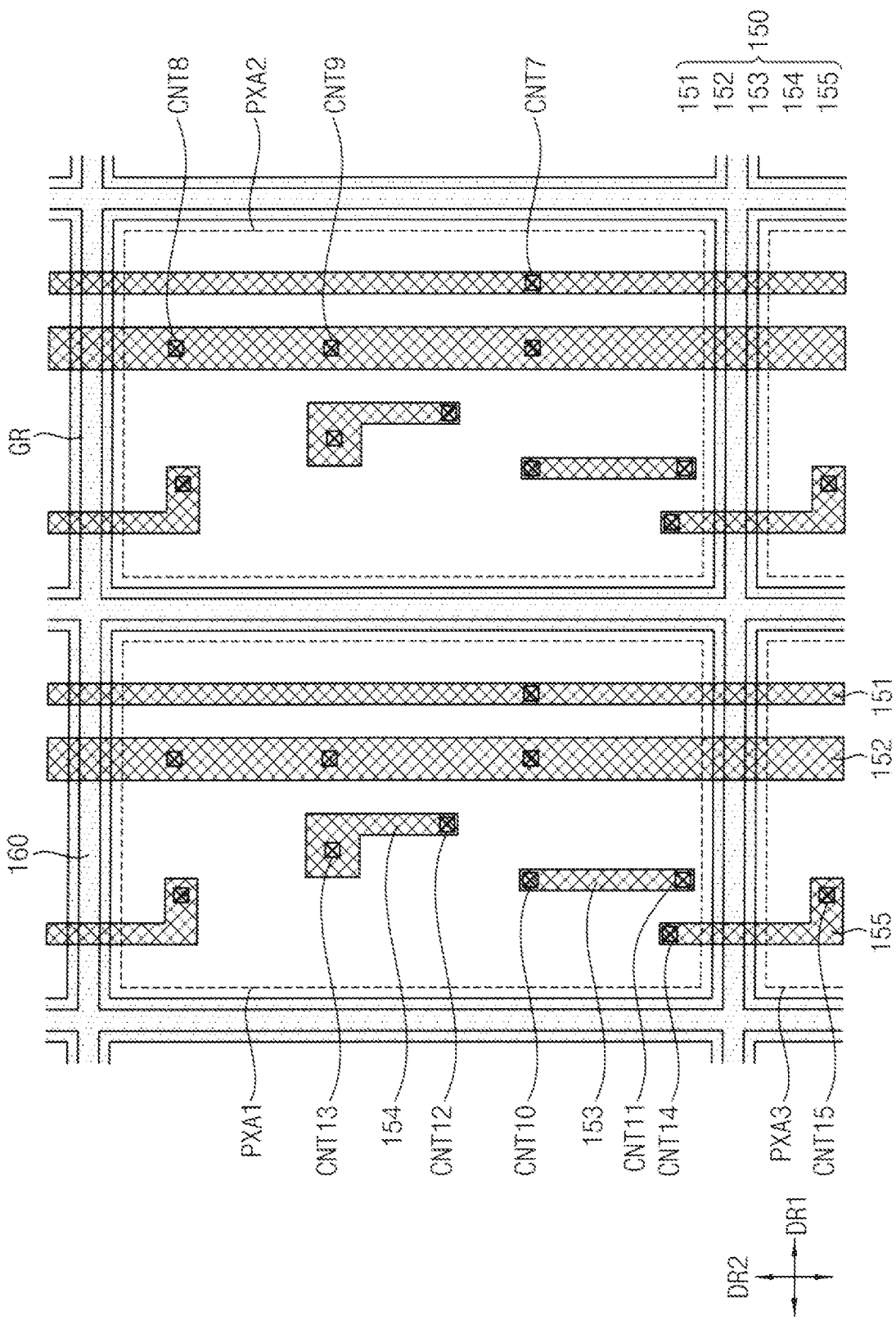

The first connection line 140 and the second connection line 150 may be disposed on the organic insulating layer 160 to connect the plurality of pixels PX1, PX2, and PX3 to each other (the first connection line 140 may connect the plurality of pixels PX1 and PX2 to each other as illustrated in FIG. 9 and the second connection line 150 may connect the plurality of pixels PX1 and PX3 to each other as illustrated in FIG. 10). The first connection line 140 and the second connection line 150 may be positioned on the inorganic insulating layer 110 where the organic insulating layer 160 does not exist. The first and second connection lines 140 and 150 may function as wirings that transmit electrical signals to the pixels PX1, PX2, and PX3.

Since the first connection line 140 and the second connection line 150 may connect the pixels PX1, PX2, and PX3 to each other, the first connection line 140 and the second connection line 150 may be relatively longer compared to other lines. Accordingly, there may be a high possibility that stress is applied to the first and second connection lines 140 and 150.

Therefore, since the first connection line 140 and the second connection line 150 include a material having a high elongation rate, defects such as crack or disconnection may not occur in the first connection line 140 and the second connection line 150. For example, the first connection line 140 and the second connection line 150 may include aluminum (Al). The first connection line 140 and the second connection line 150 may have a multilayer structure. In an embodiment, the first connection line 140 and the second connection line 150 may have a Ti/Al/Ti stacked structure. In an embodiment, an elongation rate of the first connection line 140 and an elongation rate of the second connection line 150 may be greater than elongation rates of lines disposed thereunder.

Hereinafter, a display device according to an embodiment will be described in detail with reference to FIGS. 4 to 12.

FIGS. 5 to 10 illustrates arrangements of a semiconductor layer, lines, electrodes, etc. positioned on the same layer, and an insulating layer may be interposed between the layers illustrated in FIGS. 5 to 10. For example, the buffer layer 111 may be interposed between the layer illustrated in FIG. 5 and the layer illustrated in FIG. 6, the first insulating layer 112 may be interposed between the layer illustrated in FIG. 6 and the layer illustrated in FIG. 7, the second insulating layer 113 may be interposed between the layer illustrated in FIG. 7 and the layer illustrated in FIG. 8, the third insulating layer 114 may be interposed between the layer illustrated in FIG. 8 and the layer illustrated in FIG. 9, and a fourth insulating layer 115 may be interposed between the layer illustrated in FIG. 9 and the layer illustrated in FIG. 10. The layers illustrated in FIGS. 5 to 10 may be electrically connected to each other through contact holes defined in at least some of the above-described insulating layers.

Figure 5:
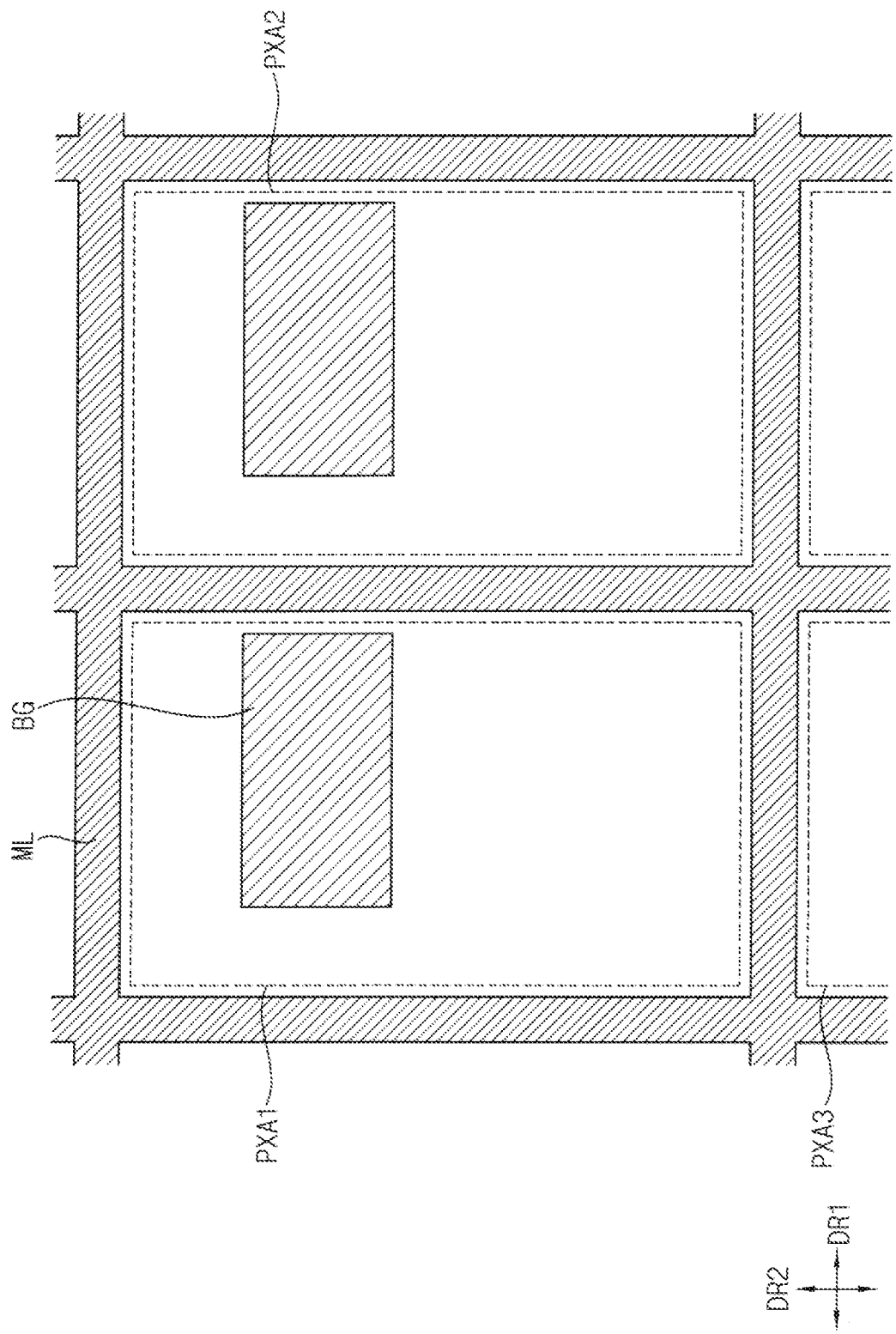
FIGS. 5, 6, 7, 8, 9, and 10 are layout views illustrating elements in FIG. 4 for each layer.

Referring to FIGS. 4, 5, and 11, the metal layer ML and the lower gate electrode BG may be disposed on the same layer and may include the same material. For example, the metal layer ML and the lower gate electrode BG may include molybdenum (Mo), copper (Cu), titanium (Ti), or the like, and may be formed of a single layer or multiple layers.

The metal layer ML and the lower gate electrode BG may be disposed on a barrier layer 101 disposed on the substrate 100. The substrate 100 may include glass, metal, or plastic. In an embodiment, the substrate 100 may include a material having a flexible or bendable characteristic. When the substrate 100 has the flexible or bendable characteristic, the substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a single layer structure or a multilayer structure of the above materials, and may further include an inorganic layer in the case of the multilayer structure. In an embodiment, the substrate 100 may have an organic/inorganic/organic structure.

The substrate 100 may include a plurality of pixel areas PXA1, PXA2, and PXA3 on which pixels PX1, PX2, and PX3 are respectively positioned. The pixel areas PXA1, PXA2, and PXA3 may include a first pixel area PXA1 on which the first pixel PX1 is positioned, a second pixel area PXA2 on which the second pixel PX2 is positioned, and a third pixel area PXA3 on which the third pixel PX3 is positioned. The first to third pixel areas PXA1, PXA2, and PXA3 may be spaced apart from each other. The second pixel area PXA2 may be positioned in the first direction DR1 from the first pixel area PXA1, and the third pixel area PXA3 may be positioned in the second direction DR2 from the first pixel area PXA1.

The barrier layer 101 may prevent or minimize impurities from the substrate 100 from penetrating upward. The barrier layer 101 may include an inorganic material such as silicon oxide, silicon nitride, silicon oxynitride, or the like, and may have a single layer or multilayer structure.

The metal layer ML may be disposed between the pixel areas PXA1, PXA2, and PXA3. In an embodiment, the metal layer ML may surround each of the pixel areas PXA1, PXA2, and PXA3. In other words, the metal layer ML may surround one pixel area.

The lower gate electrode BG may be an island type and disposed in each of the pixel areas PXA1, PXA2, and PXA3. In the present embodiment, the lower gate electrode BG of each of the pixels may be formed to be separated from each other. For example, the lower gate electrode BG of the first pixel PX1 may be formed to be spaced apart from the lower gate electrode BG of the second pixel PX2.

The buffer layer 111 may be disposed on the metal layer ML and the lower gate electrode BG. The buffer layer 111 may include an inorganic material including oxide or nitride. The buffer layer 111 may serve to increase the smoothness of an upper surface of the substrate 100 and may include an inorganic material such as silicon oxide, silicon nitride, silicon oxynitride, or the like.

Figure 6:
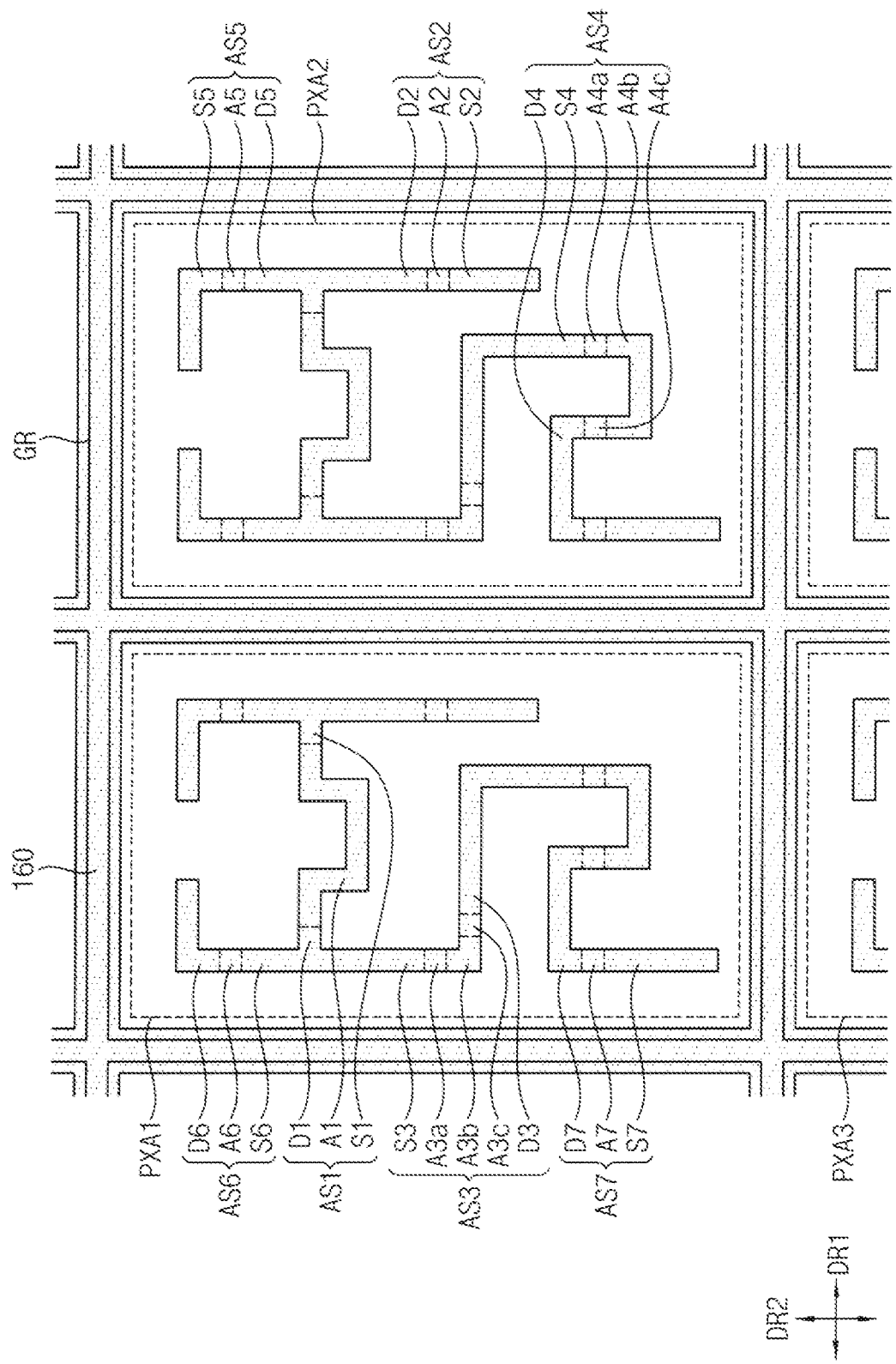

Referring to FIGS. 4, 6, and 11, semiconductor layers AS1 to AS7 of the driving transistor T1, the switching transistor T2, the compensation transistor T3, the first initialization transistor T4, the operation control transistor T5, the emission control transistor T6, and the second initialization transistor T7 may be disposed on the buffer layer 111. The semiconductor layers AS1 to AS7 may be disposed on the same layer and may include the same material. For example, the semiconductor layers AS1 to AS7 may be formed of polycrystalline silicon.

A driving semiconductor layer AS1 of the driving transistor T1, a switching semiconductor layer AS2 of the switching transistor T2, a compensation semiconductor layer AS3 of the compensation transistor T3, a first initialization semiconductor layer AS4 of the first initialization transistor T4, an operation control semiconductor layer AS5 of the operation control transistor T5, an emission control semiconductor layer AS6 of the emission control transistor T6, and a second initialization semiconductor layer AS7 of the second initialization transistor T7 may be connected to each other and bent into various shapes.

Each of the semiconductor layers AS1 to AS7 may include a channel region, and a source region and a drain region on opposite sides of the channel region. In an embodiment, the source region and the drain region may be doped with impurities, and the impurities may include N-type impurities or P-type impurities. The source region and the drain region correspond to a source electrode and a drain electrode, respectively. Hereinafter, the terms of the source region and the drain region are used instead of the source electrode or the drain electrode.

The driving semiconductor layer AS1 may include a driving channel region A1, and a driving source region S1 and a driving drain region D1 on opposite sides of the driving channel region A1. The driving semiconductor layer AS1 may have a curved shape, and the driving channel region A1 may be formed to be longer than the other channel regions A2 to A7. For example, when the driving semiconductor layer AS1 has a shape bent a plurality of times such as 'Ω' or 'S', a long channel length may be formed in a narrow space. Since the driving channel region A1 is formed long, a driving range of a gate voltage applied to the driving gate electrode G1 may be widened, so that the grayscale of light emitted from the organic light emitting diode OLED may be more precisely controlled, and the display quality may be improved.

The driving semiconductor layer AS1 may overlap the lower gate electrode BG. Specifically, the driving channel region A1 of the driving semiconductor layer AS1 may overlap the lower gate electrode BG, and the lower gate electrode BG may function as a gate electrode of the driving transistor T1.

The switching semiconductor layer AS2 may include a switching channel region A2, and a switching source region S2 and a switching drain region D2 on opposite sides of the switching channel region A2. The switching drain region D2 may be connected to the driving source region S1.

The compensation semiconductor layer AS3 may include compensation channel regions A3*a* and A3*c*, and a compensation source region S3 and a compensation drain region D3 on opposite sides of the compensation channel regions A3*a* and A3*c*. The compensation transistor T3 is a dual transistor, and the compensation semiconductor layer AS3 may include two compensation channel regions A3*a* and A3*c*. A region A3*b* between the compensation channel regions A3*a* and A3*c* may be a region doped with impurities, and may correspond to a source region of one of the dual transistors and a drain region of the other of the dual transistors.

The first initialization semiconductor layer AS4 may include first initialization channel regions A4*a* and A4*c*, and a first initialization source region S4 and a first initialization drain region D4 on opposite sides of the first initialization channel regions A4*a* and A4*c*. The first initialization transistor T4 is a dual transistor, and the first initialization semiconductor layer AS4 may include two first initialization channel regions A4*a* and A4*c*. A region A4*b* between the first initialization channel regions A4*a* and A4*c* may be a region doped with impurities, and may correspond to a source region of one of the dual transistors and a drain region of the other of the dual transistors.

The operation control semiconductor layer AS5 may include an operation control channel region A5, and an operation control source region S5 and an operation control drain region D5 on opposite sides of the operation control channel region A5. The operation control drain region D5 may be connected to the driving source region S1.

The emission control semiconductor layer AS6 may include an emission control channel region A6, and an emission control source region S6 and an emission control drain region D6 on opposite sides of the emission control channel region A6. The emission control source region S6 may be connected to the driving drain region D1.

The second initialization semiconductor layer AS7 may include a second initialization channel region A7, and a second initialization source region S7 and a second initialization drain region D7 on opposite sides of the second initialization channel region A7.

The first insulating layer 112 may be disposed on the semiconductor layers AS1 to AS7. The first insulating layer 112 may include an inorganic material including oxide or nitride. For example, the first insulating layer 112 may include silicon oxide, silicon nitride, silicon oxynitride, aluminum oxide, titanium oxide, tantalum oxide, hafnium oxide, zinc oxide, or the like.

In the present embodiment, the semiconductor layers AS1 to AS7 of each of the pixels may be formed to be separated from each other. For example, the semiconductor layers AS1 to AS7 of the first pixel PX1 may be formed to be spaced apart from the semiconductor layers AS1 to AS7 of the second pixel PX2.

Figure 7:
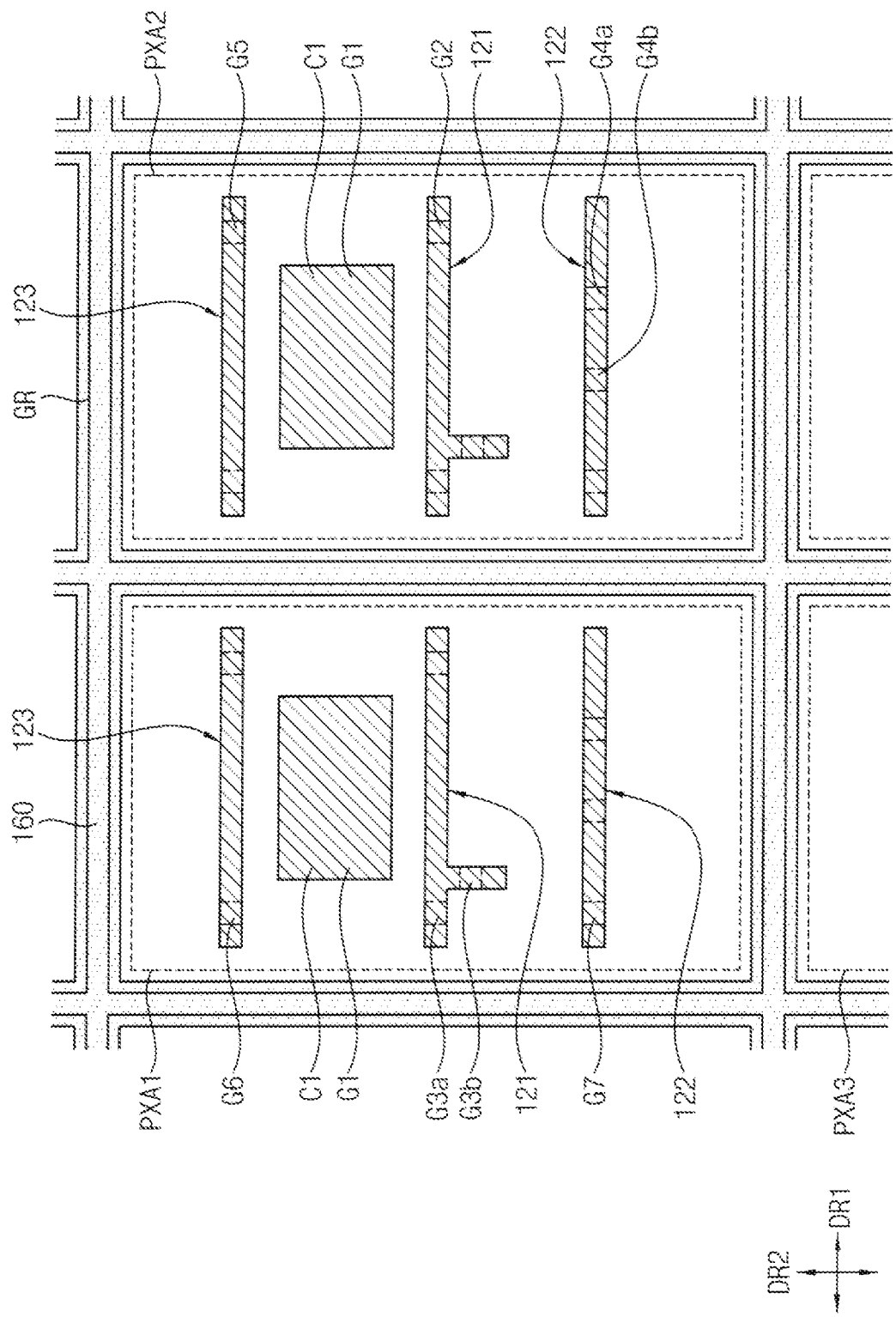

Referring to FIGS. 4, 7, and 11, the scan line 121, the previous scan line 122, the emission control line 123, and the driving gate electrode G1 may be disposed on the first insulating layer 112. The scan line 121, the previous scan line 122, the emission control line 123, and the driving gate electrode G1 may be disposed on the same layer and may include the same material. For example, the scan line 121, the previous scan line 122, the emission control line 123, and the driving gate electrode G1 may include molybdenum (Mo), copper (Cu), titanium (Ti), or the like, and may be formed of a single layer or multiple layers.

The driving gate electrode G1 may be an island type and may overlap the driving channel region A1 of the driving semiconductor layer AS1. The driving gate electrode G1 may perform not only a function as a gate electrode of the driving transistor T1 but also a function as a first electrode C1 of the storage capacitor Cst.

Part or protruding portions of the scan line 121, the previous scan line 122, and the emission control line 123 may correspond to gate electrodes of the transistors T2 to T7 (parts of the scan line 121 may correspond to the gate electrodes of the transistors T2 and T3, parts of the previous scan line 122 may correspond to the gate electrodes of the transistors T4 and T7, and parts of the emission control line 123 may correspond to the gate electrodes of the transistors T5 and T6 as illustrated in FIG. 7).

Regions of the scan line 121 overlapping the switching channel region A2 and the compensation channel regions A3a and A3c may correspond to the switching gate electrode G2 and the compensation gate electrodes G3a and G3b, respectively. Regions of the previous scan lines 122 overlapping the first initialization channel regions A4a and A4c and the second initialization channel region A7 may correspond to the first initialization gate electrodes G4a and G4b and the second initialization gate electrode G7, respectively. Regions of the emission control line 123 overlapping the operation control channel region A5 and the emission control channel region A6 may correspond to the operation control gate electrode G5 and the emission control gate electrode G6, respectively.

The compensation gate electrodes G3a and G3b may be dual gate electrodes including a first compensation gate electrode G3a and a second compensation gate electrode G3b, and may serve to prevent or reduce the occurrence of a leakage current.

In the present embodiment, the scan line 121, the previous scan line 122, the emission control line 123, and the driving gate electrode G1 of each of the pixels may be formed to be separated from each other. For example, the scan line 121, the previous scan line 122, the emission control line 123, and the driving gate electrode G1 of the first pixel PX1 may be formed to be spaced apart from the scan lines 121, the previous scan line 122, the emission control line 123, and the driving gate electrode G1 of the second pixel PX2.

The scan line 121, the previous scan line 122, and the emission control line 123 of the first pixel PX1 may be connected to the scan line 121, the previous scan line 122, and the emission control line 123 the second pixel PX2, respectively, by the first connection line 140 disposed on a different layer.

A second insulating layer 113 may be disposed on the scan line 121, the previous scan line 122, the emission control line 123, and the driving gate electrode G1. The second insulating layer 113 may include an inorganic material including oxide or nitride. For example, the second insulating layer 113 may include silicon oxide, silicon nitride, silicon oxynitride, aluminum oxide, titanium oxide, tantalum oxide, hafnium oxide, zinc oxide, or the like.

Figure 8:
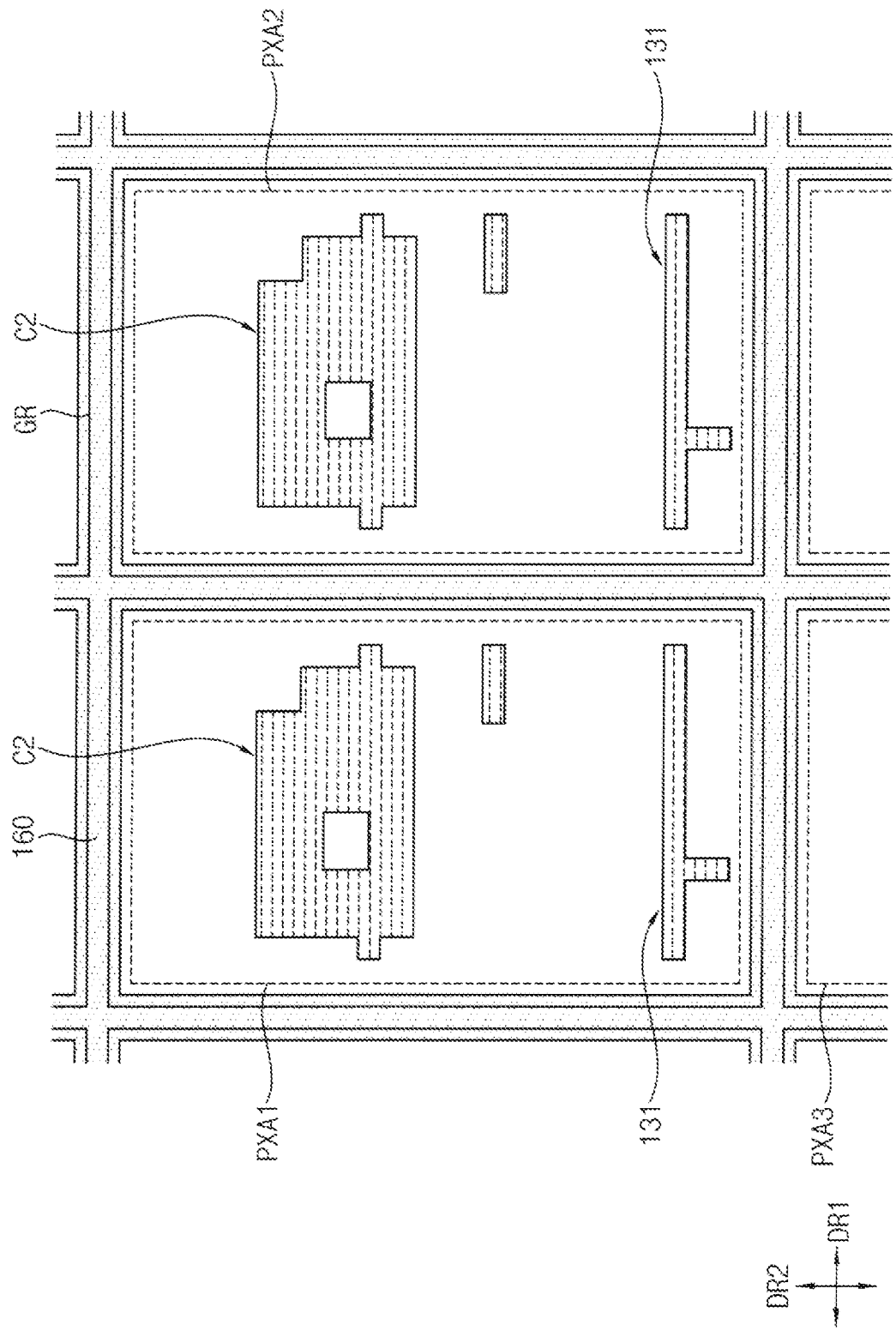

Referring to FIGS. 4, 8, and 11, a second electrode C2 of the storage capacitor Cst and the initialization voltage line 131 may be disposed on the second insulating layer 113. The second electrode C2 of the storage capacitor Cst and the initialization voltage line 131 may be disposed on the same layer and may include the same material. For example, the second electrode C2 of the storage capacitor Cst and the initialization voltage line 131 may include a conductive material including molybdenum (Mo), copper (Cu), titanium (Ti), or the like, and may be formed of a single layer or multiple layers.

In the present embodiment, the second electrode C2 of the storage capacitor Cst and the initialization voltage line 131 of each of the pixels may be formed to be separated from each other. For example, the second electrode C2 of the storage capacitor Cst of the first pixel PX1 and the second electrode C2 of the storage capacitor Cst of the second pixel PX2 may be disposed to be spaced apart from each other. In addition, the initialization voltage line 131 of the first pixel PX1 and the initialization voltage line 131 of the second pixel PX2 may be disposed to be spaced apart from each other.

A third insulating layer 114 may be disposed on the second electrode C2 of the storage capacitor Cst and the initialization voltage line 131. The third insulating layer 114 may include an inorganic material including oxide or nitride. For example, the third insulating layer 114 may include silicon oxide, silicon nitride, silicon oxynitride, aluminum oxide, titanium oxide, tantalum oxide, hafnium oxide, zinc oxide, or the like.

Referring to FIGS. 4, 9, and 11, the first connection line 140 extending in the first direction DR1 may be disposed on the third insulating layer 114. The first connection line 140 may include an emission control connection line 141, a mesh connection line 142, a scan connection line 143, a previous scan connection line 144, an initialization voltage connection line 145, and a first node connection line 146.

The emission control connection line 141 may connect the emission control line 123 of the first pixel PX1 and the emission control line 123 of the pixel PX2 via contact holes CNT1a and CNT1b formed through the third insulating layer 114 and the second insulating layer 113. The emission control connection line 141 may extend along the first direction DR1 while overlapping the emission control line 123 of the first pixel PX1 and the emission control line 123 of the second pixel PX2.

The mesh connection line 142 may connect the second electrode C2 of the first pixel PX1 and the second electrode C2 of the second pixel PX2 via contact holes CNT3a and CNT2b formed through the third insulating layer 114. Since the second electrode C2 of the storage capacitor Cst is connected to the driving voltage line 152 to receive the driving voltage, the mesh connection line 142 may serve to transmit driving voltage across a plurality of pixels arranged in the first direction DR1. A driving voltage line having a mesh structure may be formed by the mesh connection line 142 without securing a space for arranging a separate driving voltage line extending in the first direction DR1. Accordingly, a space for the storage capacitor Cst may be further secured, so that a high-definition display device may be implemented.

The scan connection line 143 may connect the scan line 121 of the first pixel PX1 and the scan line 121 of the second pixel PX2 via contact holes CNT4a and CNT4b formed through the third insulating layer 114 and the second insulating layer 113. The scan connection line 143 may extend in the first direction DR1 while overlapping the scan line 121 of the first pixel PX1 and the scan line 121 of the second pixel PX2.

The previous scan connection line 144 may connect the previous scan line 122 of the first pixel PX1 and the previous scan line 122 of the pixel PX2 via contact holes CNT5a and CNT5b formed through the third insulating layer 114 and the second insulating layer 113. The previous scan connection line 144 may extend in the first direction DR1 while overlapping the previous scan line 122 of the first pixel PX1 and the previous scan line 122 of the second pixel PX2.

The initialization voltage connection line 145 may connect the initialization voltage line 131 of the first pixel PX1 and the initialization voltage line 131 of the second pixel PX2 via contact holes CNT6a and CNT6b formed through the third insulating layer 114. The initialization voltage connection line 145 may extend in the first direction DR1 while overlapping the initialization voltage line 131 of the first pixel PX1 and the initialization voltage line 131 of the second pixel PX2.

The first node connection line 146 may connect the lower gate electrode BG to the driving source region S1 of the driving transistor T1 via contact holes CNTa and CNTb. The first node connection line 146 may be connected to the lower gate electrode BG via the contact hole CNTa passing through the third insulating layer 114, the second insulating layer 113, the first insulating layer 112, and the buffer layer 111, and may be connected to the driving source region S1 via the contact hole CNTb passing through the third insulating layer 114, the second insulating layer 113, and the first insulating layer 112.

The emission control connection line 141, the mesh connection line 142, the scan connection line 143, the previous scan connection line 144, and the initialization voltage connection line 145 may connect the first pixel PX1 and the second pixel PX2 While extending from the first pixel area PXA1 to the second pixel area PXA2. The emission control connection line 141, the mesh connection line 142, the scan connection line 143, the previous scan connection line 144, and the initialization voltage connection line 145 may connect a plurality of pixels arranged in the first direction DR1.

In the present embodiment, the semiconductor layers AS1 to AS7 and conductive layers such as the signal lines 121, 122, 123, the initialization voltage line 131, and the first electrode C1 and the second electrode C2 of the storage capacitor Cst disposed under the first connection line 140 may be separately formed for each pixel. Accordingly, it is possible to prevent stress generated in one pixel from propagating to another pixel. The first connection line 140 may be formed of a material having a high elongation rate, thereby minimizing defects due to stress.

As described above, the emission control connection line 141, the mesh connection line 142, the scan connection line 143, the previous scan connection line 144, and the initialization voltage connection line 145 may connect the first pixel PX1 and the second pixel PX2 while crossing an upper portion of the organic insulating layer 160 disposed therebetween, thereby serving to supply electrical signals to a plurality of pixels.

The fourth insulating layer 115 having an opening 115a between pixels and the fifth insulating layer 116 disposed on the fourth insulating layer 115 and filling the opening 115a of the fourth insulating layer 115 may be disposed on the first connection line 140. The fourth insulating layer 115 may include an inorganic material including oxide or nitride. For example, the fourth insulating layer 115 may include silicon oxide, silicon nitride, silicon oxynitride, aluminum oxide, titanium oxide, tantalum oxide, hafnium oxide, zinc oxide, or the like, and the fifth insulating layer 116 may include an organic material such as acrylic, benzocyclobutene (BCB), polyimide (PI), hexamethyldisiloxane (HMDSO), or the like. When the fourth insulating layer 115 includes the inorganic material, the opening 115a may be formed between the pixels, so that stress applied to the fourth insulating layer 115 may not propagate. Further, since the fifth insulating layer 116 including an organic material is formed in the opening 115a, the fifth insulating layer 116 may absorb stress applied to the display device.

Referring to FIGS. 4, 10, and 11, the second connection line 150 extending in the second direction DR2 may be disposed on the fifth insulating layer 116. The second connection line 150 may be insulated from the first connection line 140 by the fourth insulating layer 115 and the fifth insulating layer 116. The second connection line 150 may include the data line 151, the driving voltage line 152, a second node connection line 153, a third node connection line 154, and an intermediate connection line 155.

The data line 151, the driving voltage line 152, the second node connection line 153, the third node connection line 154, and the intermediate connection line 155 may be disposed on the same layer and may include the same material. For example, the data line 151, the driving voltage line 152, the second node connection line 153, the third node connection line 154, and the intermediate connection line 155 may be formed of a conductive material having a high elongation rate. For example, the data line 151, the driving voltage line 152, the second node connection line 153, the third node connection line 154, and the intermediate connection line 155 may include aluminum (Al). In an embodiment, the data line 151, the driving voltage line 152, the second node connection line 153, the third node connection line 154, and the intermediate connection line 155 may be formed of a Ti/Al/Ti multilayer structure.

The data line 151 may be connected to the switching source region S2 of the switching transistor T2 via a contact hole CNT7 passing through the fifth insulating layer 116, the fourth insulating layer 115, the third insulating layer 114, the second insulating layer 113, and the first insulating layer 112. The data line 151 may connect a plurality of pixels arranged in the second direction DR2, for example, the first pixel PX1 and the third pixel PX3.

The driving voltage line 152 may be connected to the operation control source region S5 of the operation control transistor T5 via a contact hole CNT8 passing through the fifth insulating layer 116, the fourth insulating layer 115, the third insulating layer 114, the second insulating layer 113, and the first insulating layer 112. Further, the driving voltage line 152 may be connected to the second electrode C2 of the storage capacitor Cst via a contact hole CNT9 passing through the fifth insulating layer 116, the fourth insulating layer 115, and the third insulating layer 114. The driving voltage line 152 may connect a plurality of pixels arranged in the second direction DR2, for example, the first pixel PX1 and the third pixel PX3.

The second node connection line 153 may transmit the initialization voltage VINT for initializing the driving transistor T1 and a pixel electrode 310. The second node connection line 153 may be connected to the first and second initialization transistors T4 and T7 via a contact hole CNT10 passing through the fifth insulating layer 116, the fourth insulating layer 115, the third insulating layer 114, the second insulating layer 113, and the first insulating layer 112, and may be connected to the initialization voltage line 131 via a contact hole CNT11 passing through the fifth insulating layer 116, the fourth insulating layer 115, and the third insulating layer 114.

The third node connection line 154 may connect the driving gate electrode G1 and the compensation drain region D3 of the compensation transistor T3 via contact holes CNT12 and CNT13. That is, the third node connection line 154 may connect the driving gate electrode G1 via the contact hole CNT13 and the third node connection line 154 may connect the compensation drain region D3 of the compensation transistor T3 via the contact hole CNT12 as illustrated in FIG. 4. The island-type driving gate electrode G1 may be electrically connected to the compensation transistor T3 by the third node connection line 154.

The intermediate connection line 155 may be connected to the second initialization source region S7 of the second initialization transistor T7 via a contact hole CNT14 passing through the fifth insulating layer 116, the fourth insulating layer 115, the third insulating layer 114, the second insulating layer 113, and the first insulating layer 112. The intermediate connection line 155 may be connected to the emission control drain region D6 of the emission control transistor T6 via a contact hole CNT15 passing through the fifth insulating layer 116, the fourth insulating layer 115, the third insulating layer 114, the second insulating layer 113, and the first insulating layer 112.

The data line 151, the driving voltage line 152, and the intermediate connection line 155 may connect adjacent pixels, e.g., the first pixel PX1 and the third pixel PX3, in the second direction DR2, while passing through the organic insulating layer 160 between the adjacent pixels.

A planarization layer 117 may be disposed on the second connection line 150. The planarization layer 117 may include an organic material such as acrylic, benzocyclobutene (BCB), polyimide (PI), hexamethyldisiloxane (HMDSO), or the like. The planarization layer 117 may serve to generally planarize upper portions of the transistors T1 to T7. The planarization layer 117 may be provided as a single layer or multiple layers.

Referring to FIG. 11, the organic insulating layer 160 may be disposed between the first pixel PX1 and the second pixel PX2 to fill at least a portion of the groove GR of the inorganic insulating layer 110. The organic insulating layer 160 may not completely fill the groove GR. Further, the organic insulating layer 160 may not be filled in a portion of the groove GR.

However, in order for the organic insulating layer 160 to absorb external impacts, it may be desirable to completely fill the grooves GR. In an embodiment, the organic insulating layer 160 may be formed to extend to an upper surface of the inorganic insulating layer 110. In such an embodiment, an upper surface of the organic insulating layer 160 may be provided in a convex shape due to the characteristics of the organic insulating layer 160. In other words, a maximum height h of the organic insulating layer 160 may be greater than a depth d of the groove GR.

An angle between the upper surface of the organic insulating layer 160 and the upper surface of the inorganic insulating layer 110 may be less than about 45 degrees. If the slope of the boundary where the upper surface of the inorganic insulating layer 110 and the upper surface of the organic insulating layer 160 contact is not smooth, a conductive material used in the process of forming the first connection line 140 by patterning a conductive layer may remain on the boundary without being removed therefrom. In this case, a short circuit between the remaining conductive material and other conductive layers may occur. Therefore, it may be desirable to form the upper surface of the organic insulating layer 160 to have a gentle slope with respect to the upper surface of the inorganic insulating layer 110.

The organic insulating layer 160 may include acrylic, methacrylic, polyester, polyethylene, polypropylene, polyethylene terephthalate, polyethylene naphthalate, polycarbonate, polyimide, polyethylene sulfonate, polyoxymethylene, polyarylate, hexamethyldisiloxane, or the like.

The organic insulating layer 160 may be disposed in the groove GR of the inorganic insulating layer 110 between the first pixel PX1 and the second pixel PX2, so that the first pixel PX1 and the second pixel PX2 may be separated under the first connection line 140. Accordingly, it is possible to prevent stress or cracks from propagating from the first pixel PX1 to the second pixel PX2.

The organic light emitting diode OLED including a pixel electrode 310, an opposite electrode 330, and an intermediate layer 320 interposed therebetween and including an emission layer may be disposed on the planarization layer 117.

The pixel electrode 310 may be connected to the intermediate connection line 155 through a contact hole defined in the planarization layer 117, and may be connected to the emission control drain region D6 of the emission control transistor T6 by the intermediate connection line 155.

A pixel defining layer 118 may be disposed on the planarization layer 117. The pixel defining layer 118 may serve to define a pixel by having an opening corresponding to each pixel, that is, an opening exposing at least a central portion of the pixel electrode 310. In addition, the pixel defining layer 118 may increase a distance between an edge of the pixel electrode 310 and the opposite electrode 330 above the pixel electrode 310, so that generating an arc at the edge of the pixel electrode 310 may be prevented. For example, the pixel defining layer 118 may be formed of an organic material such as polyimide or hexamethyldisiloxane (HMDSO).

The intermediate layer 320 of the organic light emitting diode OLED may include a low molecular weight material or a high molecular weight material. When the intermediate layer 320 includes the low molecular weight material, the intermediate layer 320 may have a structure in which a hole injection layer (HIL), a hole transport layer (HTL), an emission layer (EML), an electron transport layer (ETL), electron injection layer (EIL), etc. are stacked in a single or complex structure, and may include copper phthalocyanine (CuPc), N,N-di(naphthalen-1-yl)-N,N'-Diphenyl-benzidine (N,N'-Di(naphthalene-1-yl)-N,N'-diphenyl-benzidine: NPB), tris-8-hydroxyquinoline aluminum (tris-8-hydroxyquinoline aluminum) (Alq3), or the like.

When the intermediate layer 320 includes the high molecular weight material, the intermediate layer 320 may have a structure including a hole transport layer (HTL) and an emission layer (EML). In this case, the HTL may include PEDOT, and the EML may include a high molecular weight material such as poly-phenylenevinylene (PPV) and polyfluorene. The intermediate layer 320 may include a layer integrally formed over the plurality of pixel electrodes 310, or may include a layer patterned to correspond to each of the plurality of pixel electrodes 310.

The opposite electrode 330 may be disposed above the display area DA, and may be disposed to cover the display area DA as illustrated in FIG. 11. In other words, the opposite electrode 330 may be integrally formed over the plurality of organic light emitting diodes OLED to correspond to the plurality of pixel electrodes 310.

In an embodiment, the pixel electrode 310 and the opposite electrode 330 may be an anode and a cathode of the organic light emitting diode OLED, respectively. However, present invention is not limited thereto, and in another embodiment, the pixel electrode 310 and the opposite electrode 330 may be a cathode and an anode of the organic light emitting diode OLED, respectively.

Since the organic light emitting diode OLED may be easily damaged by moisture or oxygen from the outside, an encapsulation layer 400 may cover and protect the organic light emitting diode OLED. The encapsulation layer 400 may cover the display area DA and extend outside the display area DA. The encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include ceramic, metal oxide, metal nitride, metal carbide, metal oxynitride, indium oxide, tin oxide, indium tin oxide (ITO), silicon oxide, silicon nitride and/or silicon oxynitride. If necessary, other layers such as a capping layer may be interposed between the first inorganic encapsulation layer 410 and the opposite electrode 330. Since the first inorganic encapsulation layer 410 is formed along the lower structure, an upper surface of the first inorganic encapsulation layer 410 may not be planarized.

The organic encapsulation layer 420 may cover the first inorganic encapsulation layer 410, and unlike the first inorganic encapsulation layer 410, an upper surface of the organic encapsulation layer 420 may be substantially planarized. Specifically, an upper surface of the organic encapsulation layer 420 may be substantially planarized in a portion corresponding to the display area DA. The organic encapsulation layer 420 may include one or more materials selected from the group of acrylic, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

The second inorganic encapsulation layer 430 may cover the organic encapsulation layer 420, and may include ceramic, metal oxide, metal nitride, metal carbide, metal oxynitride, indium oxide, tin oxide, indium tin oxide (ITO), silicon oxide, silicon nitride and/or silicon oxynitride.

As described above, since the encapsulation layer 400 has a multilayer structure including the first inorganic encapsulation layer 410, the organic encapsulation layer 420, and the second inorganic encapsulation layer 430, even if a crack occurs inside the encapsulation layer 400, the crack may not be connected between the first inorganic encapsulation layer 410 and the organic encapsulation layer 420 or between the organic encapsulation layer 420 and the second inorganic encapsulation layer 430. Accordingly, it is possible to prevent or minimize a path through which moisture or oxygen from the outside penetrates into the display area DA.

Referring to FIG. 12, one end of the intermediate connection line 155 may be connected to the second initialization source region S7 of the second initialization transistor T7 of the first pixel PX1 via a contact hole CNT14 passing through the fifth insulating layer 116, the fourth insulating layer 115, the third insulating layer 114, the second insulating layer 113, and the first insulating layer 112. Further, the other end of the intermediate connection line 155 may be connected to the emission control drain region D6 of the emission control transistor T6 of the third pixel PX3 via a contact hole CNT15 passing through the fourth insulating layer 115, the third insulating layer 114, the second insulating layer 113, and the first insulating layer 112.

The intermediate connection line 155 may cross the organic insulating layer 160 disposed between the first pixel PX1 and the third pixel PX3, and may connect the first pixel PX1 and the third pixel PX3 arranged in the second direction DR2. The organic insulating layer 160 may be disposed in the groove GR of the inorganic insulating layer 110 in a region between the first pixel PX1 and the third pixel PX3, and may separate the first PX1 and the third pixel PX3 under the intermediate connection line 155. Accordingly, propagation of stress or cracks may be prevented.

FIGS. 13, 14, 15, and 16 are cross-sectional views illustrating a method of manufacturing a display device according to an embodiment. FIGS. 13, 14, 15, and 16 may illustrate a method of manufacturing the display device in FIG. 11.

Figure 13:
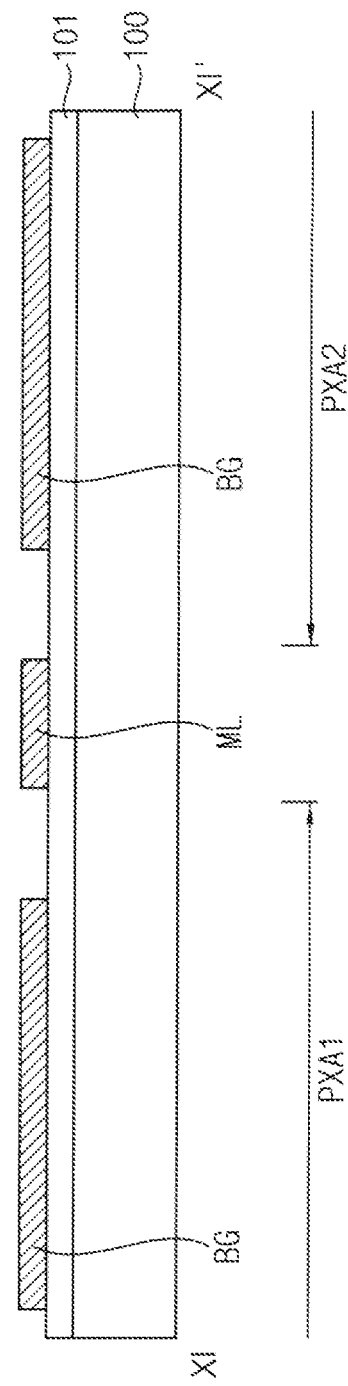
FIGS. 13, 14, 15, and 16 are cross-sectional views illustrating a method of manufacturing a display device according to an embodiment.

Referring to FIG. 13, first, the barrier layer 101 may be formed by depositing an inorganic insulating material on the substrate 100. Then, a conductive material such as a metal may be deposited on the barrier layer 101 and patterned to form the metal layer ML and the lower gate electrode BG. The metal layer ML may be formed between pixel areas, for example, between the first pixel area PXA1 and the second pixel area PXA2, and the lower gate electrode BG may be formed in each of the pixel areas.

Accordingly, the metal layer ML and the lower gate electrode BG may be formed substantially simultaneously.

Figure 14:
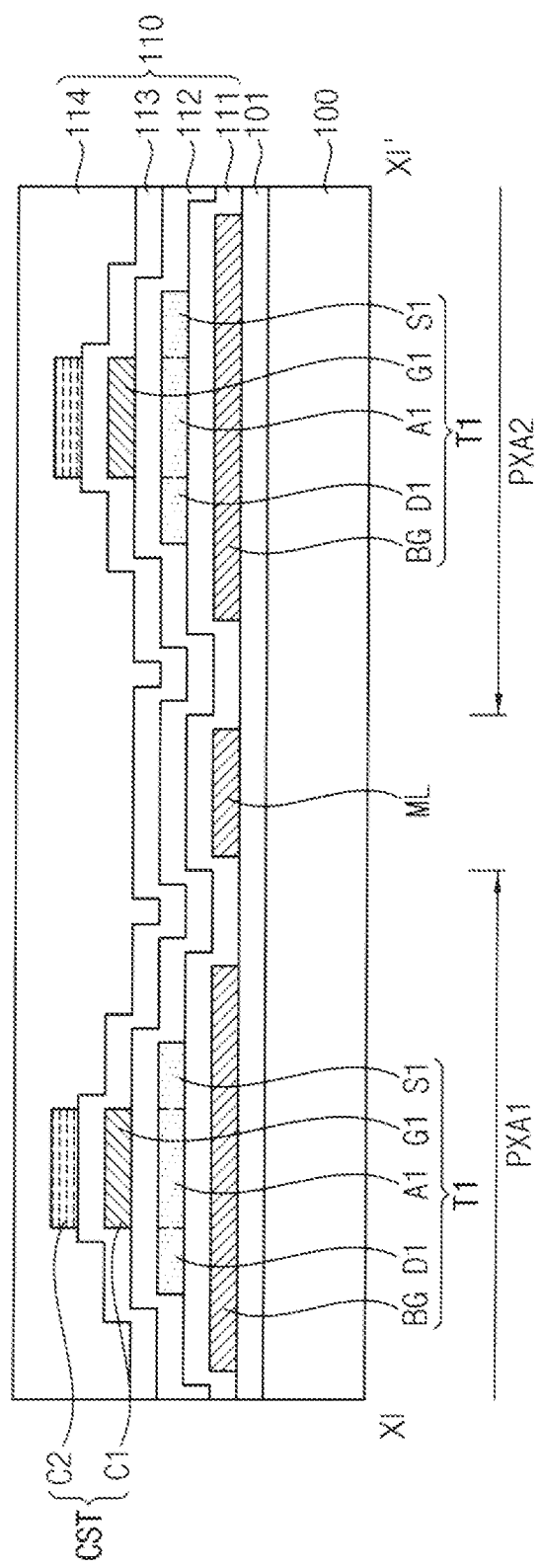

Referring to FIG. 14, transistors including the driving transistor T1, the storage capacitor Cst, and the inorganic insulating layer 110 may be formed on the substrate 100 on which the metal layer ML and the lower gate electrode BG are formed.

First, the buffer layer 111 may be formed by depositing an inorganic insulating material on the barrier layer 101 on which the metal layer ML and the lower gate electrode BG are formed. Then, a semiconductor material may be deposited on the buffer layer 111 and patterned to form semiconductor layers including the driving semiconductor layers A1, S1, and D1. Then, the first insulating layer 112 may be formed by depositing an inorganic insulating material on the buffer layer 111 on which the semiconductor layer is formed. Then, a conductive material such as a metal may be deposited on the first insulating layer 112 and patterned to form gate electrodes including the driving gate electrode G1 serving as the first electrode C1 of the storage capacitor Cst. Accordingly, the transistors including the semiconductor layers and the gate electrodes may be formed.

Then, the second insulating layer 113 may be formed by depositing an inorganic insulating material on the first insulating layer 112 on which the gate electrodes are formed. Then, a conductive material such as a metal may be deposited on the second insulating layer 113 and patterned to form the second electrode C2 of the storage capacitor Cst. Accordingly, the storage capacitor Cst including the first electrode C1 and the second electrode C2 may be formed.

Then, the third insulating layer 114 may be formed by depositing an inorganic insulating material on the second insulating layer 113 on which the second electrode C2 of the storage capacitor Cst is formed. Accordingly, the inorganic insulating layer 110 including the buffer layer 111, the first insulating layer 112, the second insulating layer 113, and the third insulating layer 114 may be formed.

Figure 15:
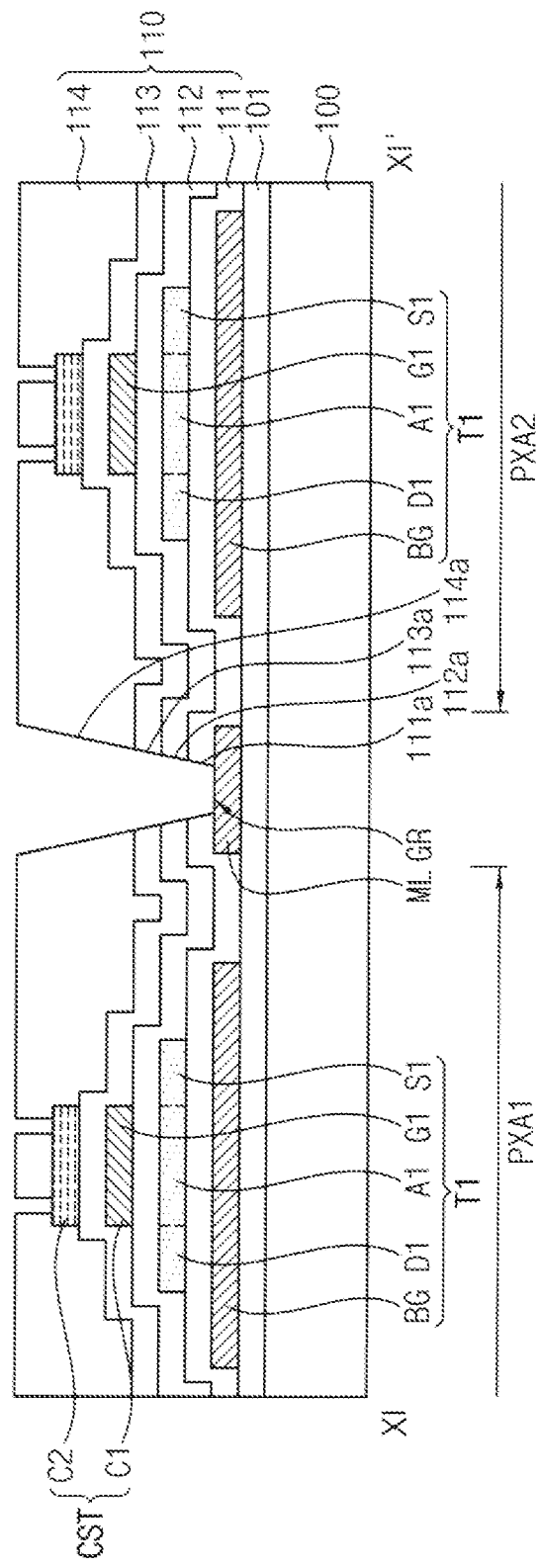

Referring to FIG. 15, the groove GR may be formed in the inorganic insulating layer 110. In order to form the groove GR in the inorganic insulating layer 110, a photo mask process and an etching process may be performed. The openings 111a, 112a, 113a, and 114a of the buffer layer 111, the first insulating layer 112, the second insulating layer 113, and the third insulating layer 114 may be formed by the etching process. For example, the etching process may be a dry etching process.

The groove GR of the inorganic insulating layer 110 may be formed on the metal layer ML positioned between the first pixel area PXA1 and the second pixel area PXA2. The groove GR of the inorganic insulating layer 110 may expose at least a portion of the metal layer ML. Specifically, the groove GR of the inorganic insulating layer 110 may expose a central portion of an upper surface of the metal layer ML.

The groove GR of the inorganic insulating layer 110 may be formed substantially simultaneously with the contact holes formed in the first pixel area PXA1 and/or the second pixel area PXA2. Alternatively, the groove GR of the inorganic insulating layer 110 may be formed after forming the contact holes formed in the first pixel area PXA1 and/or the second pixel area PXA2.

Before forming the groove GR of the inorganic insulating layer 110, the metal layer ML may be formed between the first pixel area PXA1 and the second pixel are PXA2, and when etching the inorganic insulating layer 110 to form the groove GR of the inorganic insulating layer 110, the metal layer ML may serve as an etch stop layer. Accordingly, the barrier layer 101 positioned under the metal layer ML may not be etched due to the metal layer ML, and a thickness of the barrier layer 101 and the substrate 100 under the groove GR for blocking the inflow of impurities from the outside may be secured.

Figure 16:
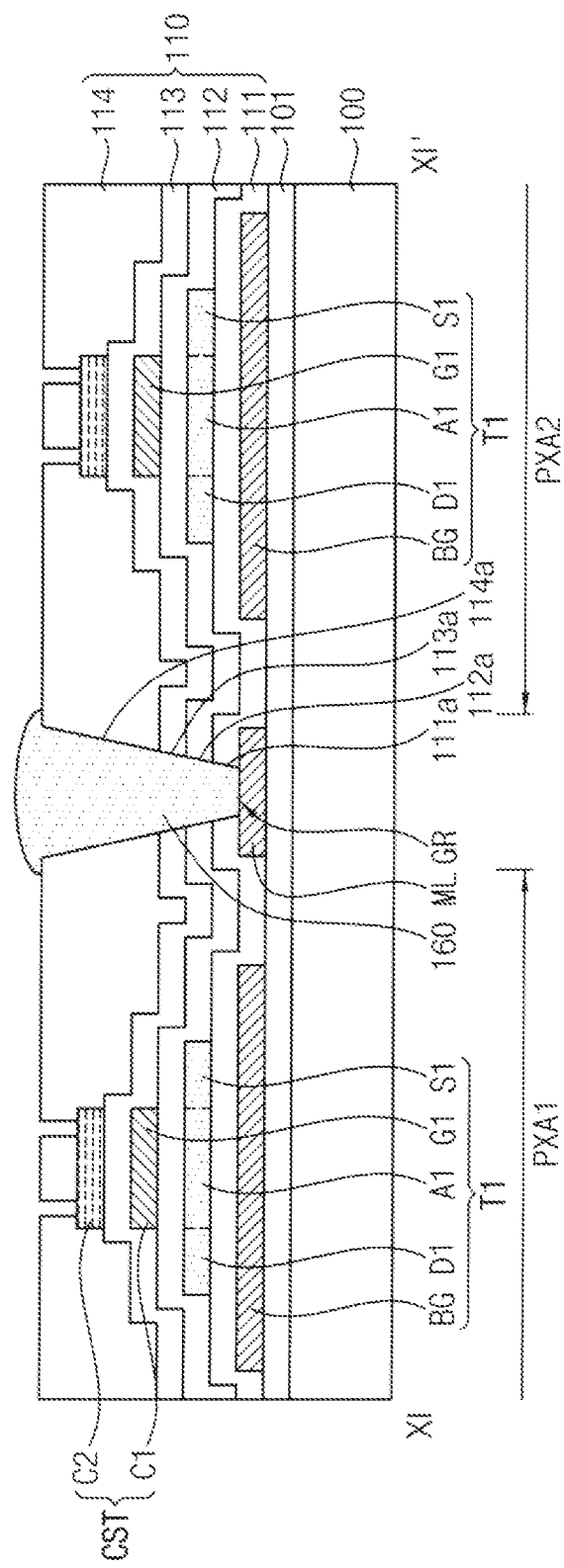

Referring to FIG. 16, the organic insulating layer 160 filling the groove GR of the inorganic insulating layer 110 may be formed. For example, an organic insulating material may be deposited on the third insulating layer 114 and patterned to form the organic insulating layer 160.

Referring to FIG. 11, the first connection line 140 may be formed on the inorganic insulating layer 110 and the organic insulating layer 160. For example, a conductive material such as metal may be deposited on the inorganic insulating layer 110 in which the groove GR is filled by the organic insulating layer 160 and patterned to form the first connection line 140. The first connection line 140 may extend from the first pixel area PXA1 to the second pixel area PXA2, and accordingly, elements of the first pixel PX1 may be connected to elements of the second pixel PX2.

Figure 17:
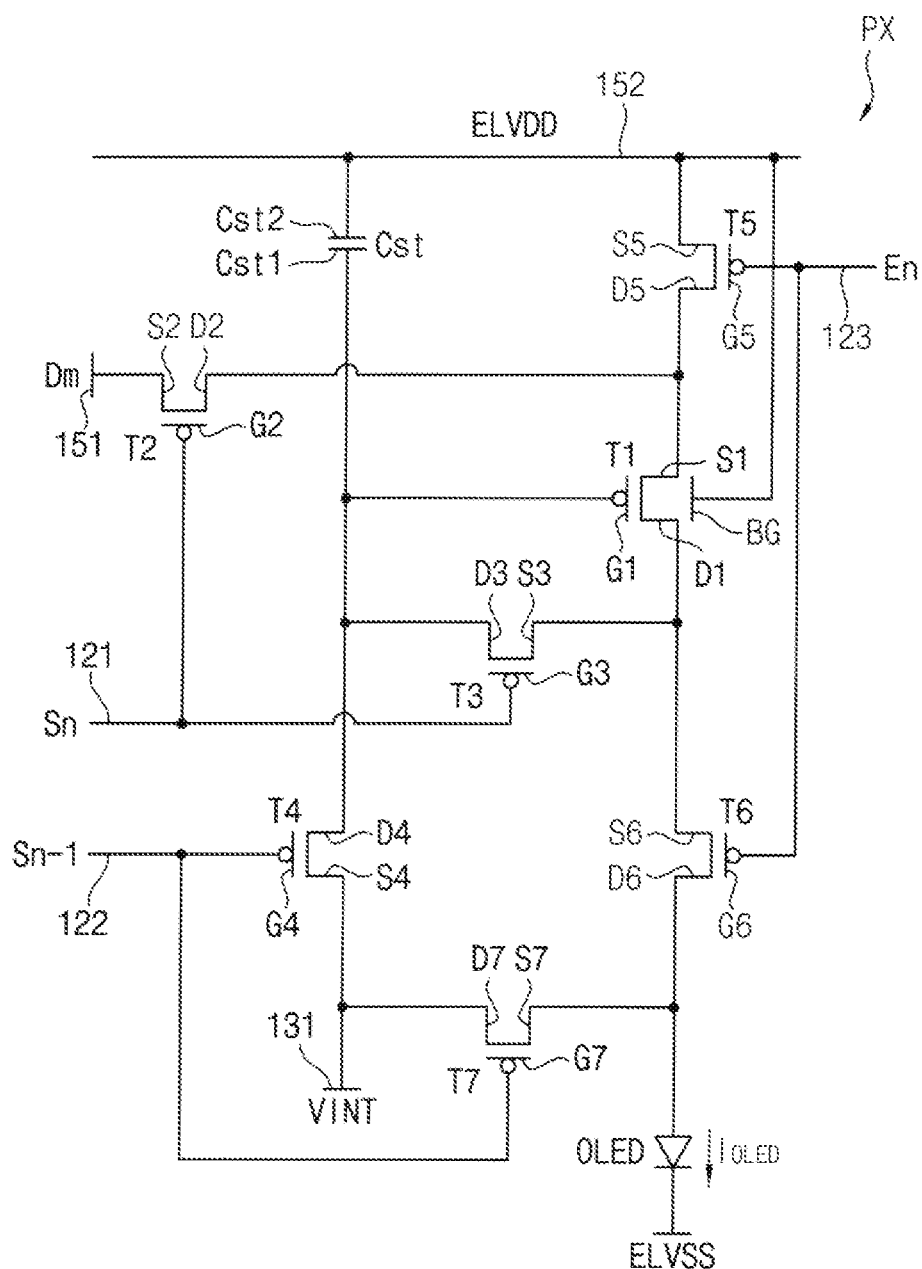
FIG. 17 is a circuit diagram illustrating a pixel according to an embodiment.
Figure 18:
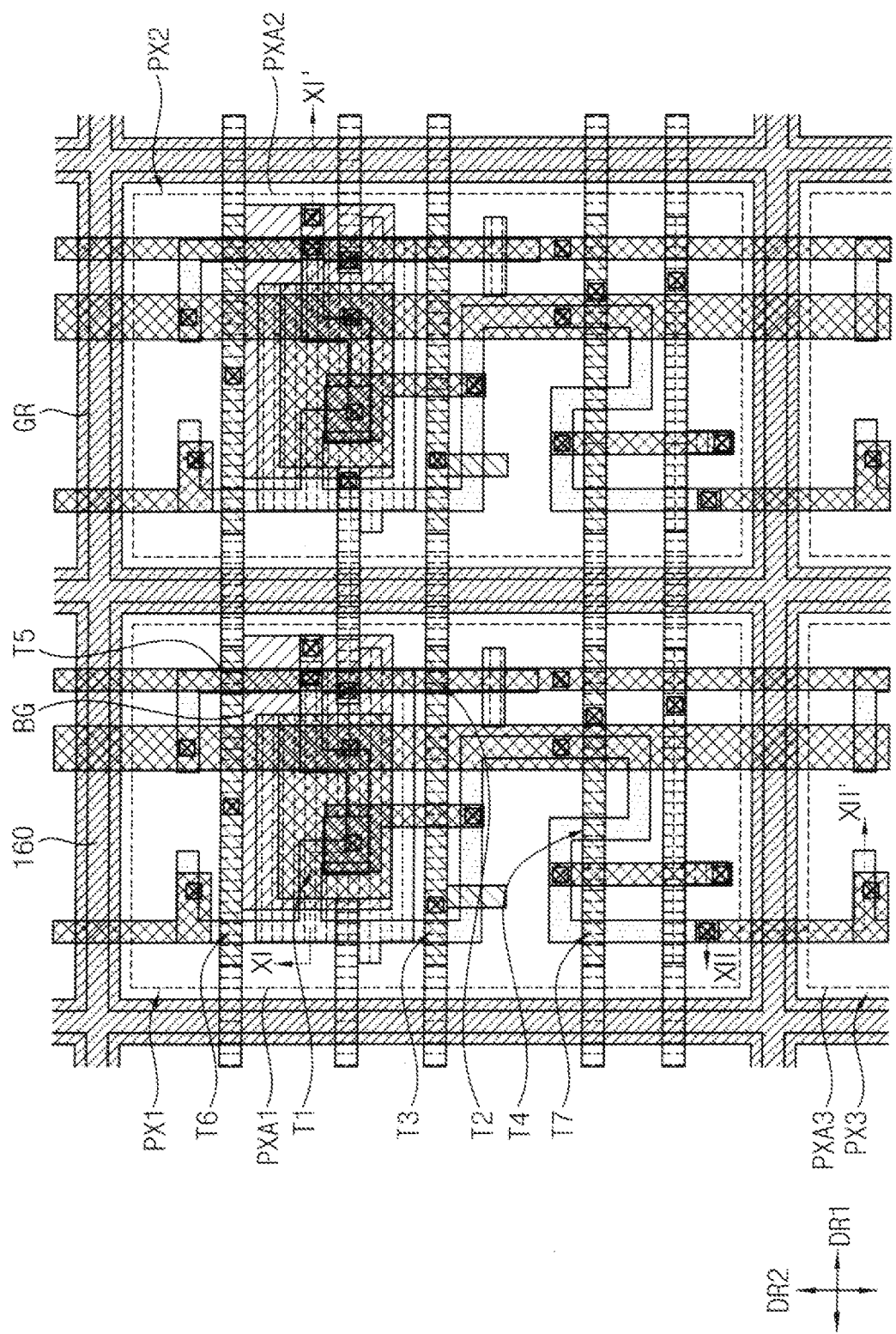
FIG. 18 is a layout view illustrating adjacent pixels according to an embodiment.
Figure 19:
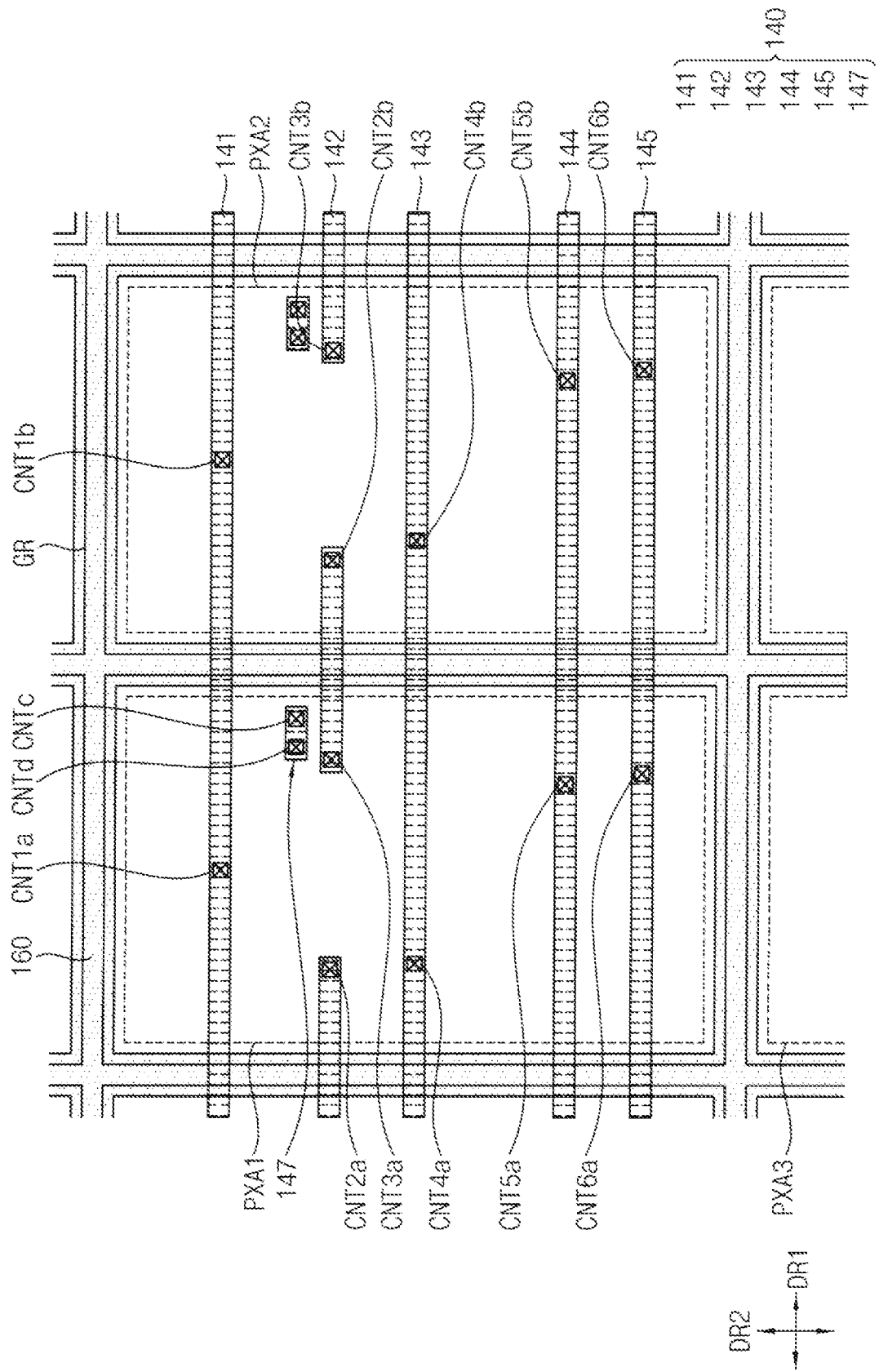
FIG. 19 is a layout view illustrating elements in FIG. 18 for each layer.

FIG. 17 is a circuit diagram illustrating a pixel according to an embodiment. FIG. 18 is a layout view illustrating adjacent pixels according to an embodiment. FIG. 19 is a layout view illustrating elements in FIG. 18 for each layer.

Referring to FIG. 17, in another embodiment, the lower gate electrode BG may be electrically connected to the driving voltage line 152. In such another embodiment, the driving voltage ELVDD may be supplied to the lower gate electrode BG.

Referring to FIGS. 18 and 19, in another embodiment, the first connection line 140 may include a fourth node connection line 147 instead of the first node connection line 146 illustrated in FIG. 9.

The fourth node connection line 147 may connect the lower gate electrode BG and the second electrode C2 in FIG. 8 of the storage capacitor Cst via contact holes CNTc and CNTd. The fourth node connection line 147 may be connected to the lower gate electrode BG via the contact hole CNTc passing through the third insulating layer 114, the second insulating layer 113, the first insulating layer 112, and the buffer layer 111, and may be connected to the second electrode C2 through the contact hole CNTd passing through the third insulating layer 114. Since the second electrode C2 of the storage capacitor Cst is connected to the driving voltage line 152 to receive the driving voltage, the lower gate electrode BG may be electrically connected to the driving voltage line 152 via the contact hole CNTd and the second electrode C2 of the storage capacitor Cst.

Figure 20:
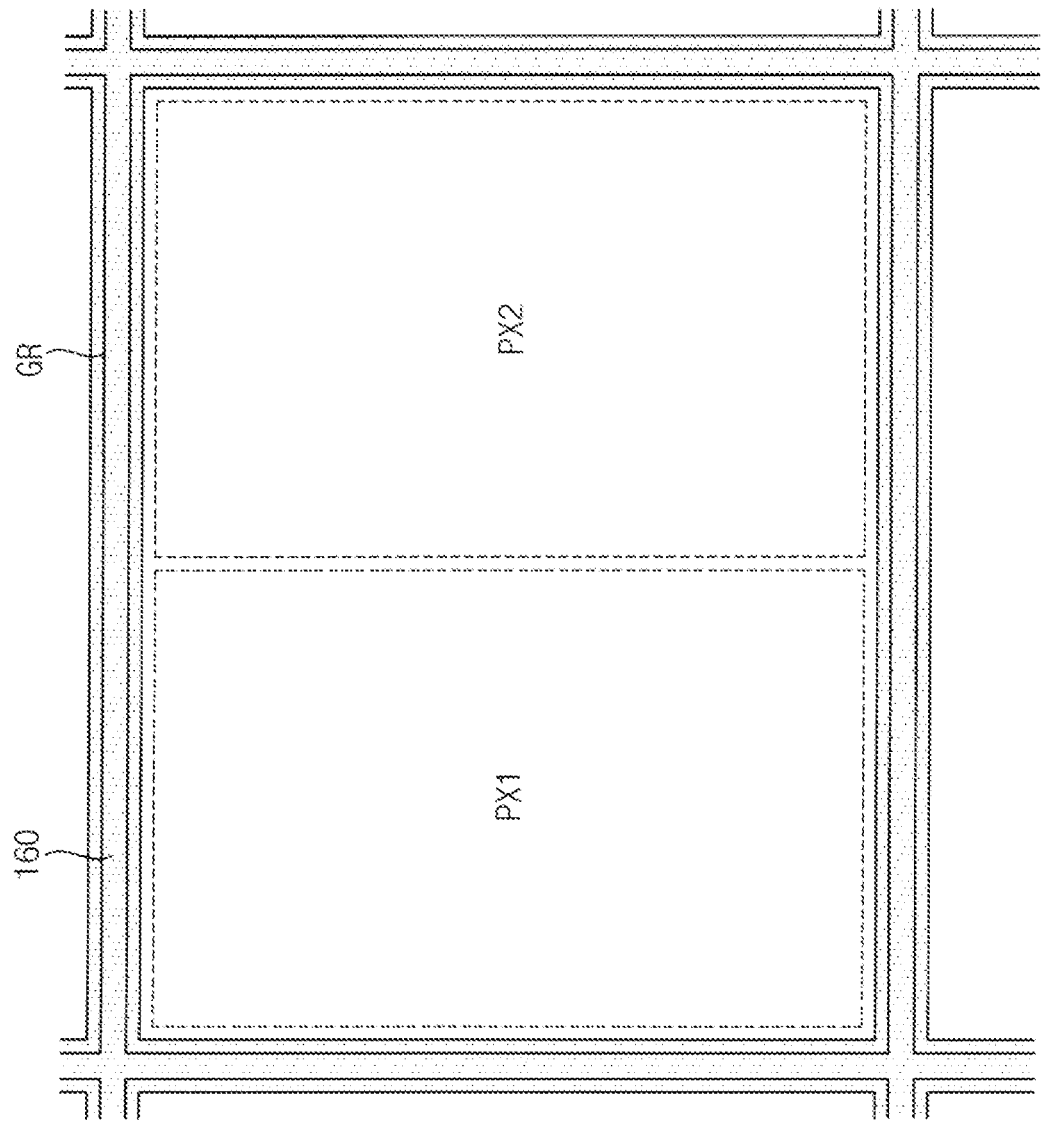
FIGS. 20 and 21 are plan views illustrating a portion of a display device according to embodiments.
Figure 21:
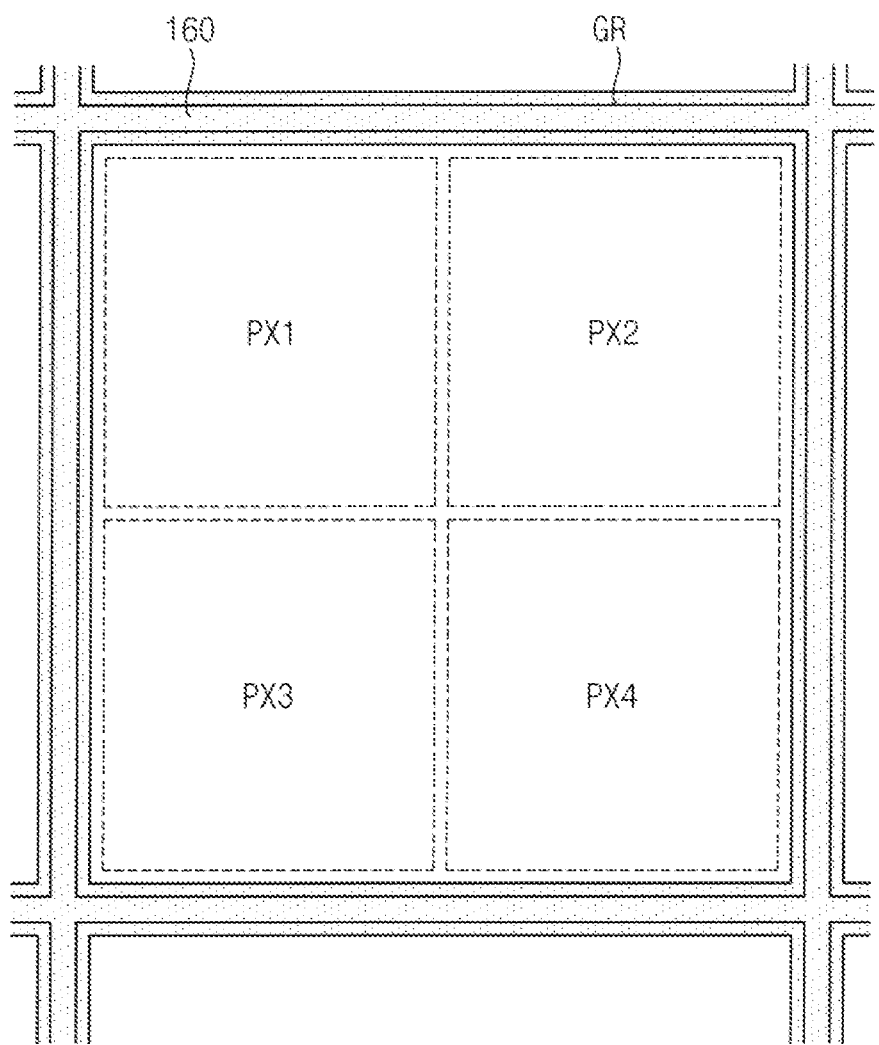

FIGS. 20 and 21 are plan views illustrating a portion of a display device according to embodiments.

Referring to FIGS. 20 and 21, the grooves GR of the inorganic insulating layer and the organic insulating layer 160 may be disposed to surround a plurality of pixels by grouping them. In the case of FIG. 20, the groove GR of the inorganic insulating layer and the organic insulating layer 160 may be disposed to surround two pixels, that is, the first pixel PX1 and the second pixel PX2. That is, the groove GR of the inorganic insulating layer and the organic insulating layer 160 may surround a group including the two pixels PX1 and PX2 as illustrated in FIG. 20. In the case of FIG. 21, the groove GR of the inorganic insulating layer and the organic insulating layer 160 may be disposed to surround four pixels PX1, PX2, PX3, and PX4. That is, the groove GR of the inorganic insulating layer and the organic insulating layer 160 may surround a group including the four pixels PX1, PX2, PX3, and PX4 as illustrated in FIG. 21. However, embodiments of the present invention are not limited thereto, and the number of pixels to be grouped may be variously modified.

The number of pixels to be grouped may be the same or different according to positions in one display device. For example, the groove GR of the inorganic insulating layer and the organic insulating layer 160 may be disposed to surround one pixel in a region subject to a high risk of cracks or stress, and may be disposed to surround a plurality of pixels in another region.

Figure 22:
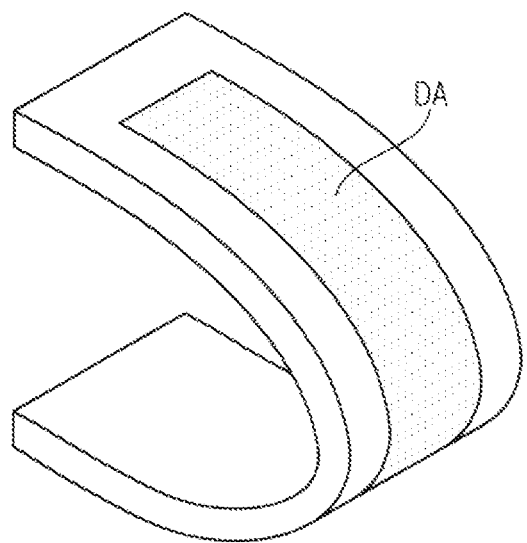
FIGS. 22 and 23 are diagrams illustrating a display device according to embodiments.
Figure 23:
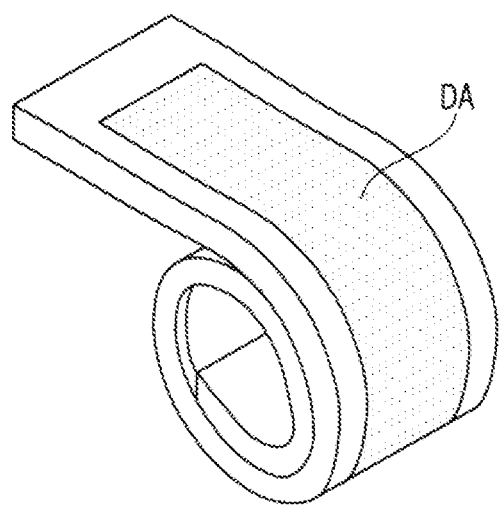

FIGS. 22 and 23 are diagrams illustrating a display device according to embodiments. FIG. 22 illustrates that a display area is folded, and FIG. 23 illustrate that a display area is rolled.

The display device according to an embodiment may include the groove GR of the inorganic insulating layer and the organic insulating layer 160 filling the groove GR in the display area DA, so that the display area DA may be folded or rolled as illustrated in FIGS. 22 and 23. Even if the display area DA is folded or rolled, the occurrence of cracks may be minimized due to the grooves GR of the inorganic insulating layer, and the organic insulating layer 160 filling the grooves GR of the inorganic insulating layer may absorb tensile stress by bending.

Figure 24:
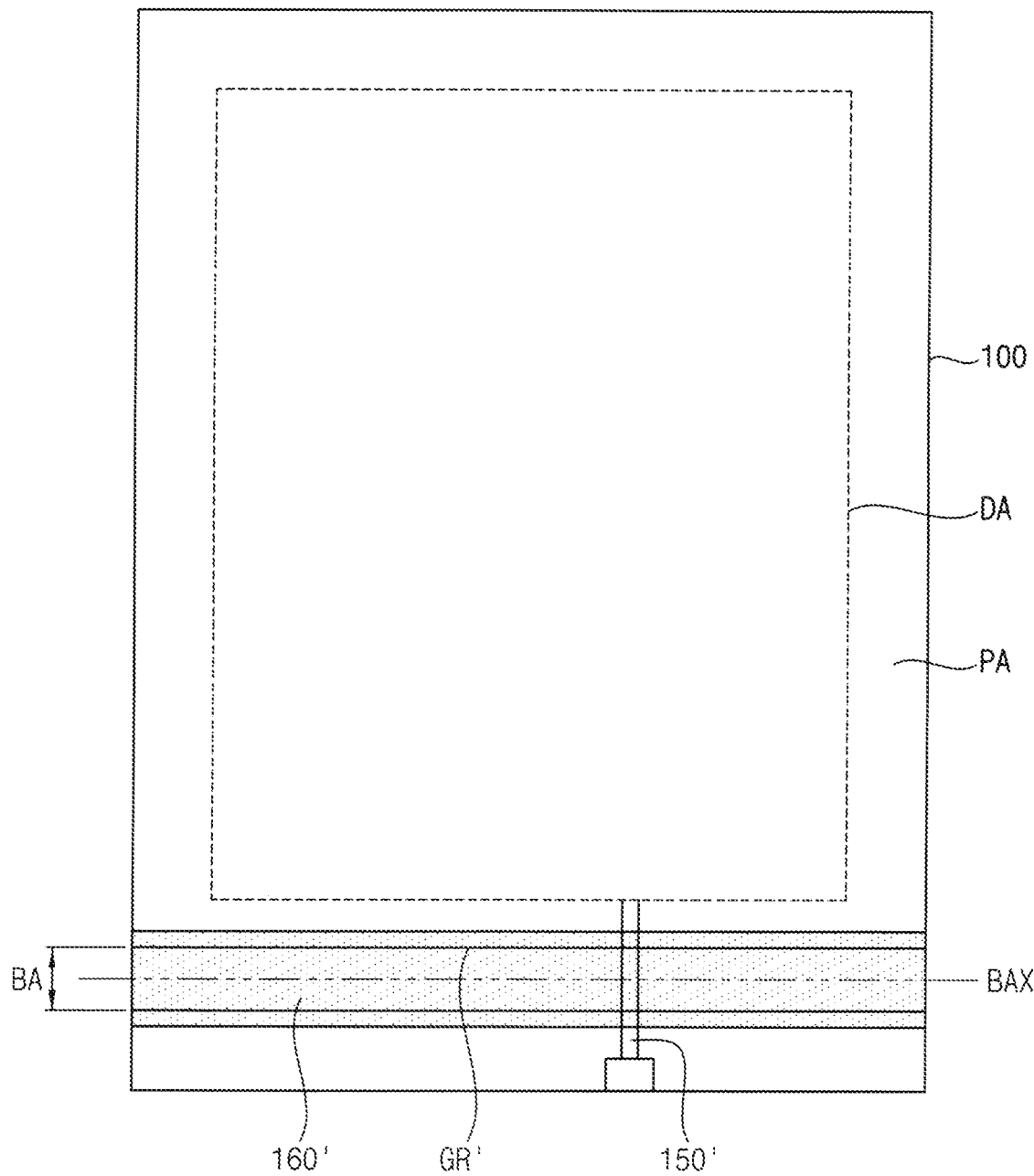
FIG. 24 is a plan view illustrating a display device according to an embodiment.

FIG. 24 is a plan view illustrating a display device according to an embodiment.

Referring to FIG. 24, the display device according to an embodiment may have a bending area BA that is bent around a bending axis BAX in the peripheral area PA, and may further include a bending groove GR' and a bending organic insulating layer 160' filling the bending groove GR'. The display device may further include a fan-out line 150' disposed on the bending organic insulating layer 160' and extending from the display area DA to cross the bending area BA.

The bending groove GR' may mean an opening formed in the inorganic insulating layer in the bending area BA. The bending groove GR' may be formed substantially simultaneously when forming the groove GR in FIG. 11 in the inorganic insulating layer in the display area DA.

The bending organic insulating layer 160' may fill the bending groove GR', and may serve to absorb tensile stress applied during bending. The bending organic insulating layer 160' may be formed of substantially the same material as the organic insulating layer 160 in FIG. 11 in the display area DA.

The fan-out line 150' may mean a wiring that is disposed in the peripheral area PA and transmits, to the display area DA, an electrical signal provided from a driving driver IC or a flexible circuit board disposed in the peripheral area PA.

The fan-out line 150' may be formed of substantially the same material as the first connection line 140 or the second connection line 150 in the display area DA. In other words, the fan-out line 150' may include a material having a high elongation rate. For example, the fan-out line 150' may include aluminum (Al).

The display device according to the embodiments of the present invention may be applied to a display device included in a computer, a notebook, a mobile phone, a smartphone, a smart pad, a PMP, a PDA, an MP3 player, or the like.

Although the display devices and the methods of manufacturing the display devices according to the embodiments of the present invention have been described with reference to the drawings, the illustrated embodiments are examples, and may be modified and changed by a person having ordinary knowledge in the relevant technical field without departing from the technical spirit of the present invention described in the following claims.

THE DESCRIPTION OF THE REFERENCE NUMERALS

100: substrate
101: barrier layer
110: inorganic insulating layer
140: first connection line
150: second connection line
160: organic insulating layer
PXA1: first pixel area
PXA2: second pixel area
PXA3: third pixel area
ML: metal layer
BG: lower gate electrode
GR: groove

The invention claimed is:

1. A display device comprising:
   a substrate comprising a first pixel area on which a first pixel is positioned and a second pixel area on which a second pixel is positioned;
   a metal layer on the substrate between the first pixel area and the second pixel area;
   an inorganic insulating layer on the metal layer, the inorganic insulating layer having a groove exposing at least a portion of the metal layer; and
   an organic insulating layer filling the groove of the inorganic insulating layer,
   wherein an upper surface of the organic insulating layer at a center of the groove is higher than the upper surface of the organic insulating layer at an edge of the groove.

2. The display device of claim 1, wherein the groove exposes at least a portion of an upper surface of the metal layer, and
   wherein the organic insulating layer contacts the upper surface of the metal layer.

3. The display device of claim 1, further comprising:
   a barrier layer between the substrate and the metal layer.

4. The display device of claim 1, wherein each of the first pixel and the second pixel comprises a lower gate electrode positioned on a same layer as the metal layer.

5. The display device of claim 4, wherein each of the first pixel and the second pixel further comprises a driving transistor comprising a driving gate electrode, a driving source electrode, and a driving drain electrode, and
   wherein the lower gate electrode overlaps the driving transistor.

6. The display device of claim 5, wherein the lower gate electrode is electrically connected to the driving source electrode.

7. The display device of claim 5, further comprising:
   a driving voltage line to supply a driving voltage to the driving transistor,
   wherein the lower gate electrode is electrically connected to the driving voltage line.

8. The display device of claim 1, wherein the organic insulating layer extends to an upper surface of the inorganic insulating layer.

9. The display device of claim 1, wherein the second pixel area is positioned in a first direction from the first pixel area, and
   wherein the groove of the inorganic insulating layer extends in a second direction intersecting the first direction.

10. The display device of claim 9, further comprising:
    a first connection line on the organic insulating layer, the first connection line extending in the first direction.

11. The display device of claim 10, wherein the first pixel and the second pixel respectively comprise a first scan line and a second scan line with the organic insulating layer therebetween, and
    wherein the first scan line and the second scan line are connected by the first connection line.

12. The display device of claim 11, wherein the first connection line is greater in elongation rate than each of the first scan line and the second scan line.

13. The display device of claim 1, wherein an angle between the upper surface of the organic insulating layer and an upper surface of the inorganic insulating layer is less than about 45 degrees.

14. A display device comprising:
    a substrate comprising a plurality of pixel areas;
    a metal layer on the substrate between the plurality of pixel areas;

an inorganic insulating layer on the metal layer, the inorganic insulating layer having a groove exposing at least a portion of the metal layer; and an organic insulating layer filling the groove of the inorganic insulating layer, wherein the organic insulating layer extends between the plurality of pixel areas in a first direction and in a second direction intersecting to the first direction.

15. The display device of claim 14, wherein the organic insulating layer surrounds at least a portion of the plurality of the pixel areas.

16. A display device comprising:

a substrate comprising a plurality of pixel areas;

a metal layer on the substrate between the plurality of pixel areas;

an inorganic insulating layer on the metal layer, the inorganic insulating layer having a groove exposing at least a portion of the metal layer; and an organic insulating layer filling the groove of the inorganic insulating layer, wherein the organic insulating layer surrounds each of the plurality of the pixel areas.

17. A display device comprising:

a substrate comprising a plurality of pixel areas;

a metal layer on the substrate between the plurality of pixel areas;

an inorganic insulating layer on the metal layer, the inorganic insulating layer having a groove exposing at least a portion of the metal layer;

an organic insulating layer filling the groove of the inorganic insulating layer; and a first connection line on the organic insulating layer, extending in a first direction, and crossing the plurality of pixel areas.

18. The display device of claim 17, further comprising:

a second connection line insulated from the first connection line, extending in a second direction intersecting the first direction, and crossing the plurality of pixel areas.

19. A method of manufacturing a display device, the method comprising:

forming a metal layer on a substrate, the metal layer being between a first pixel area and a second pixel area;

forming an inorganic insulating layer on the metal layer;

forming a groove exposing at least a portion of the metal layer, the groove being in the inorganic insulating layer;

forming an organic insulating layer filling the groove of the inorganic insulating layer, and forming a first connection line on the organic insulating layer, the first connection line extending in a first direction and crossing the first pixel area and the second pixel area.

20. The method of claim 19, further comprising:

forming a first lower gate electrode and a second lower gate electrode respectively in the first pixel area and the second pixel area, wherein the metal layer, the first lower gate electrode, and the second lower gate electrode are concurrently formed.

21. The method of claim 20, further comprising:

forming a first driving transistor and a second driving transistor respectively overlapping the first lower gate electrode and the second lower gate electrode.

22. The method of claim 19, further comprising:

forming a first scan line and a second scan line respectively in the first pixel area and the second pixel area, the first scan line and the second scan line being arranged with the organic insulating layer therebetween, wherein the first scan line and the second scan line are connected by the first connection line.

* * * * *